United States Patent
Takeda

(10) Patent No.: US 9,444,458 B2
(45) Date of Patent: Sep. 13, 2016

(54) SEMICONDUCTOR DEVICE INCLUDING INVERTER GATE CIRCUIT WITH CONNECTION CONFIGURATION SWITCH CIRCUIT SWITCHING REAL VALUES OF GATE WIDTH AND GATE LENGTH

(71) Applicant: Renesas Electronics Corporation, Tokyo (JP)

(72) Inventor: Koichi Takeda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/836,805

(22) Filed: Aug. 26, 2015

(65) Prior Publication Data

US 2016/0065214 A1     Mar. 3, 2016

(30) Foreign Application Priority Data

Aug. 28, 2014 (JP) .................... 2014-173488

(51) Int. Cl.
*H03K 19/00* (2006.01)
*H03K 19/0948* (2006.01)
*H03K 19/20* (2006.01)

(52) U.S. Cl.
CPC ...... *H03K 19/0013* (2013.01); *H03K 19/0948* (2013.01); *H03K 19/20* (2013.01)

(58) Field of Classification Search
CPC .................... H03K 19/0013; H03K 19/0948; H03K 19/20

USPC .............. 326/121, 93–98, 112; 327/108, 109
See application file for complete search history.

(56) References Cited

U.S. PATENT DOCUMENTS

| | | | | |
|---|---|---|---|---|
| 2001/0045853 | A1* | 11/2001 | Saeki | G06F 7/68 327/233 |
| 2005/0258868 | A1* | 11/2005 | Komatsu | H03K 17/163 326/83 |
| 2008/0169840 | A1* | 7/2008 | Hayashi | H03K 19/018521 326/86 |
| 2009/0243663 | A1* | 10/2009 | Chalamala | H03F 3/45085 327/67 |
| 2011/0025399 | A1* | 2/2011 | Tobita | H03K 19/018521 327/333 |

FOREIGN PATENT DOCUMENTS

JP       S62-000119 A       1/1987

* cited by examiner

*Primary Examiner* — Dylan White
(74) *Attorney, Agent, or Firm* — McGinn IP Law Group, PLLC

(57) ABSTRACT

According to one embodiment, a semiconductor device includes: an inverter gate circuit which inverts and outputs a logic level of an input signal, the inverter gate circuit includes a constant current source and a switch unit which are connected in series between a first power supply wiring and a second power supply wiring, and, according to the control signal, the switch unit switches real values of a gate length and a gate width of a switch transistor configured by a transistor to which a current outputted from the constant current source is applied among a plurality of transistors.

15 Claims, 20 Drawing Sheets

| WL RATIO SELECTION SIGNAL | SW11 | SW12 | SW13 | SW14 | W/L RATIO | TRANSISTOR CONNECTION CONFIGURATION |
|---|---|---|---|---|---|---|
| 1 | ON | OFF | OFF | ON | 0.6 | N11+N12 |
| 2 | OFF | ON | OFF | ON | 1 | N11 |
| 3 | OFF | ON | ON | OFF | 1.5 | N12 |
| 4 | OFF | ON | ON | ON | 2.5 | N11\|\|N12 |

Fig. 9

| WL RATIO SELECTION SIGNAL | SW11 | SW12 | SW13 | SW31 | SW32 | SW33 | W/L RATIO | TRANSISTOR CONNECTION CONFIGURATION |
|---|---|---|---|---|---|---|---|---|
| 1 | ON | OFF | OFF | ON | OFF | OFF | 1/3 | N11 + N12 + N31 |
| 2 | OFF | ON | OFF | ON | OFF | OFF | 1/2 | N11+N31 |
| 3 | OFF | ON | ON | ON | OFF | OFF | 2/3 | (N11 \|\| N12) + N31 |
| 4 | OFF | ON | OFF | OFF | ON | OFF | 1 | N11 |
| 5 | ON | OFF | OFF | OFF | ON | ON | 3/2 | (N11 + N12) \|\| N31 |
| 6 | OFF | ON | OFF | OFF | ON | ON | 2 | N11 \|\| N31 |
| 7 | OFF | ON | ON | OFF | ON | ON | 3 | N11 \|\| N12 \|\| N31 |

| W/L RATIO SELECTION SIGNAL | SW11 | SW12 | SW13 | SW31 | SW32 | SW33 | SW41 | SW42 | SW43 | W/L RATIO | TRANSISTOR CONNECTION CONFIGURATION |
|---|---|---|---|---|---|---|---|---|---|---|---|
| 1 | ON | OFF | OFF | ON | OFF | OFF | ON | OFF | OFF | 1/4 | N11 + N12 + N31 + N41 |
| 2 | OFF | ON | OFF | ON | OFF | OFF | ON | OFF | OFF | 1/3 | N11 + N31 + N41 |
| 3 | OFF | OFF | ON | ON | OFF | OFF | ON | OFF | OFF | 2/5 | (N11 \|\| N12) + N31 + N41 |
| 4 | OFF | ON | OFF | OFF | ON | OFF | ON | OFF | OFF | 1/2 | N11 + N41 |
| 5 | ON | OFF | OFF | OFF | ON | ON | ON | OFF | OFF | 3/5 | ((N11 + N12) \|\| N31) + N41 |
| 6 | OFF | ON | OFF | OFF | ON | ON | ON | OFF | OFF | 2/3 | (N11 \|\| N31) + N41 |
| 7 | OFF | OFF | ON | OFF | ON | ON | ON | OFF | OFF | 3/4 | N11 \|\| N12 \|\| N31 + N41 |
| 8 | OFF | ON | OFF | OFF | ON | OFF | OFF | OFF | OFF | 1 | N11 |
| 9 | ON | OFF | OFF | ON | OFF | OFF | OFF | ON | OFF | 4/3 | (N11 + N12 + N31) \|\| N41 |
| 10 | OFF | ON | OFF | ON | OFF | OFF | OFF | ON | ON | 3/2 | (N11 + N31) \|\| N41 |
| 11 | OFF | OFF | ON | ON | OFF | OFF | OFF | ON | ON | 5/3 | ((N11 \|\| N12) + N31) \|\| N41 |
| 12 | OFF | ON | OFF | OFF | ON | OFF | OFF | ON | ON | 2 | N11 \|\| N41 |
| 13 | ON | OFF | OFF | OFF | ON | ON | OFF | ON | ON | 5/2 | (N11 + N12) \|\| N31 \|\| N41 |
| 14 | OFF | ON | OFF | OFF | ON | ON | OFF | ON | ON | 3 | N11 \|\| N31 \|\| N41 |
| 15 | OFF | OFF | ON | OFF | ON | ON | OFF | ON | ON | 4 | N11 \|\| N12 \|\| N31 \|\| N41 |

| WL RATIO SELECTION SIGNAL | SW11 SW51 | SW12 SW52 | SW13 SW53 | SW61 | SW62 | SW63 | W/L RATIO | TRANSISTOR CONNECTION CONFIGURATION |
|---|---|---|---|---|---|---|---|---|
| 1 | ON | OFF | OFF | ON | OFF | OFF | 1/4 | N11 + N12 + N51 + N52 |
| 2 | ON | OFF | OFF | OFF | ON | OFF | 1/2 | N11 + N12 |
| 3 | OFF | ON | ON | ON | OFF | OFF | 1 | (N11 ∥ N12) + (N51 ∥ N32) |
| 4 | OFF | ON | ON | OFF | ON | OFF | 2 | N11 ∥ N12 |
| 5 | OFF | ON | ON | OFF | ON | ON | 4 | N11 ∥ N12 ∥ N51 ∥ N52 |

CONTROL EXAMPLE 1 OF SELECTION LOGIC CIRCUIT

| COMPARISON RESULT | | | WL RATIO CONTROL SIGNAL WLCSEL OUTPUTTED FROM SELECTION LOGIC CIRCUIT |
|---|---|---|---|
| CMP1 | CMP2 | CMP3 | |
| L | L | L | 1 |
| H | L | L | 2 |
| H | H | L | 3 |
| H | H | H | 3 |

CONTROL EXAMPLE 2 OF SELECTION LOGIC CIRCUIT

| COMPARISON RESULT | | | WL RATIO CONTROL SIGNAL WLCSEL OUTPUTTED FROM SELECTION LOGIC CIRCUIT |
|---|---|---|---|
| CMP1 | CMP2 | CMP3 | |
| L | L | L | 1 |
| H | L | L | 1 |
| H | H | L | 2 |
| H | H | H | 3 |

SEMICONDUCTOR DEVICE INCLUDING INVERTER GATE CIRCUIT WITH CONNECTION CONFIGURATION SWITCH CIRCUIT SWITCHING REAL VALUES OF GATE WIDTH AND GATE LENGTH

CROSS-REFERENCE TO RELATED APPLICATIONS

This application is based upon and claims the benefit of priority from Japanese patent application No. 2014-173488, filed on Aug. 28, 2014, the disclosure of which is incorporated herein in its entirety by reference.

BACKGROUND

The present invention relates to a semiconductor device and relates to, for example, a semiconductor device which uses inverter gate circuits as comparators.

It is proposed that a semiconductor device on which a circuit such as an oscillator is mounted uses inverter gate circuits as comparators which configure an oscillator to reduce a chip area.

An oscillator disclosed in Japanese Unexamined Patent Application Publication No. 62-000119 uses inverter gate circuits having the same electrical characteristics in a constant current circuit and a level detector. Thus, the oscillator disclosed in Japanese Unexamined Patent Application Publication No. 62-000119 realizes high oscillation accuracy while simplifying a circuit configuration.

SUMMARY

However, the inverter gate circuit which is adopted in an oscillator receives an input of an input voltage having a voltage level close to a logic threshold voltage of the inverter gate circuit. Hence, there is a problem that the inverter gate circuit which receives an input of the input voltage having the voltage level close to the logic circuit produces a through-current and increases power consumption. The other tasks and new features will be more apparatus from the description of the specification and the accompanying drawings.

According to one aspect, a semiconductor device includes: an inverter gate circuit that inverts and outputs a logic level of an input signal, and the inverter gate circuit includes a constant current source and a switch unit which are connected in series between a first power supply wiring and a second power supply wiring, and, according to the control signal, the switch unit switches real values of a gate length and a gate width of a switch transistor configured by a transistor to which a current outputted from the constant current source is applied among a plurality of transistors.

In addition, a method and a system which are expressed by being replaced from the device according to the above embodiment is effective as aspects of the present invention.

According to the one embodiment, the semiconductor device can reduce power consumption.

BRIEF DESCRIPTION OF THE DRAWINGS

The above and other aspects, advantages and features will be more apparent from the following description of certain embodiments taken in conjunction with the accompanying drawings, in which:

FIG. 9 is a view for explaining types of connection configurations of the inverter gate circuit according to the second embodiment;

FIG. 11 is a view for explaining types of connection configurations of the inverter gate circuit according to the third embodiment;

FIG. 13 is a view for explaining types of connection configurations of the inverter gate circuit according to the fourth embodiment;

FIG. 15 is a view for explaining types of connection configurations of the inverter gate circuit according to the fifth embodiment;

FIG. 17 is a table for explaining optimal control examples of the semiconductor device according to the sixth embodiment;

DETAILED DESCRIPTION

For clarification of description, the following description and drawings will be optionally omitted and simplified.

First Embodiment

Figure 1:
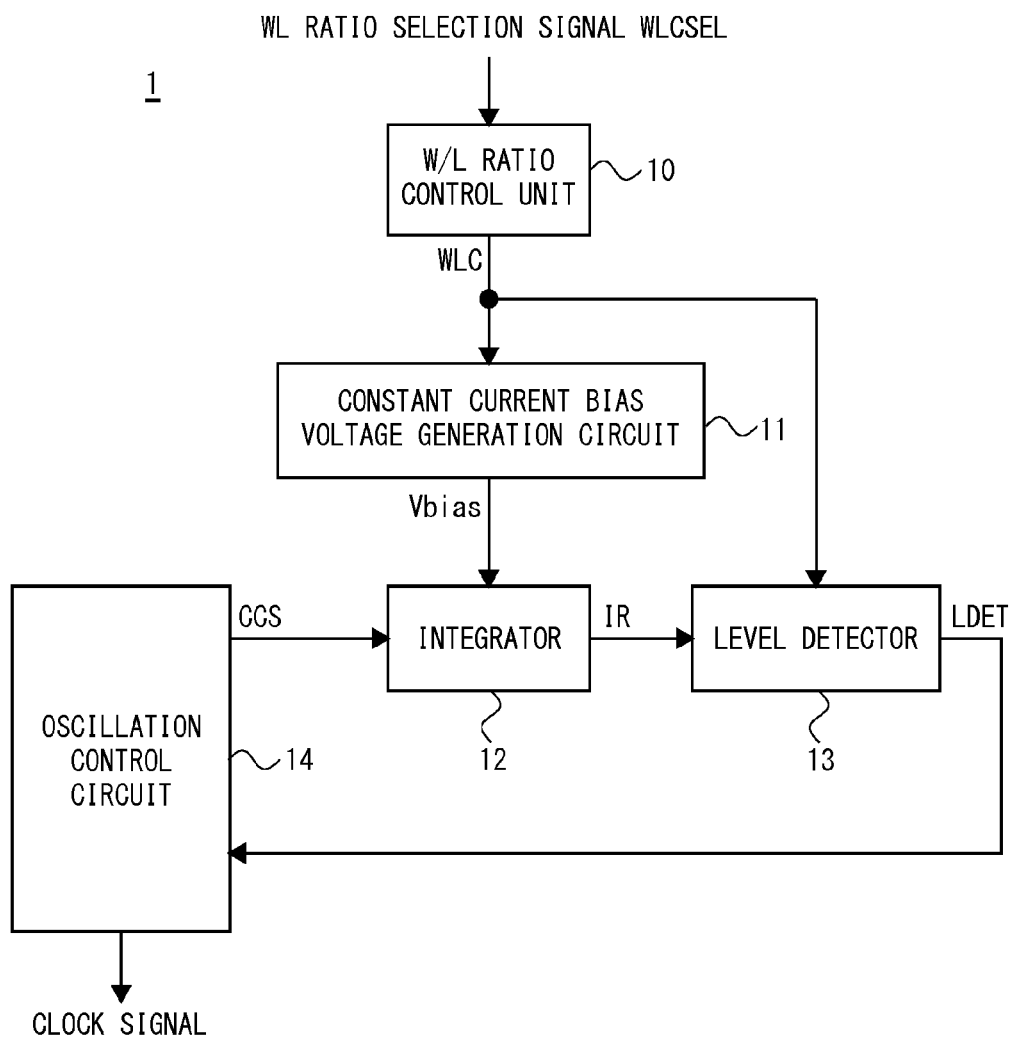
FIG. 1 is a block diagram of a semiconductor device according to a first embodiment.

FIG. 1 is a block diagram of a semiconductor device 1 according to the first embodiment. The block diagram illustrated in FIG. 1 illustrates an oscillator included in the semiconductor device 1, and the semiconductor device 1 may include other blocks, too. This oscillator will be referred to as the semiconductor device 1 below.

As illustrated in FIG. 1, the semiconductor device 1 according to the first embodiment includes a W/L ratio control unit 10, a constant current bias voltage generation circuit 11, an integrator 12, a level detector 13 and an oscillation control circuit 14.

The W/L ratio control unit 10 outputs a control signal (e.g. a WL ratio control signal WLC) for controlling W/L ratios of transistors in the constant current bias voltage generation circuit 11 and the level detector 13 according to a value of a connection configuration selection signal (e.g. a WL ratio selection signal WLSEL) supplied from an outside of the semiconductor device 1 or another block which is not illustrated. In this regard, the W/L ratio refers to a ratio of a gate width W and a gate length L of the transistor.

The constant current bias voltage generation circuit 11 generates a bias voltage Vbias for determining a current value of a constant current used in the integrator 12. This constant current bias voltage generation circuit 11 includes a feedback circuit including an inverter gate circuit, and outputs the bias voltage Vbias which fluctuates according to a current amount of an output current of the feedback circuit. This constant current bias voltage generation circuit 11 will be described in detail later.

The integrator 12 generates a sawtooth wave (e.g. an integration result IR) by charging the constant current whose current amount is determined based on the bias voltage Vbias and resetting the charged charges according to a charge/discharge control signal for switching between a charging operation and a charge resetting operation. This charge/discharge control signal CCS is a signal outputted from the oscillation control circuit 14.

The level detector 13 switches a logic level of a level detection signal LDET according to which one of a voltage level of the integration result signal IR and a level determination threshold voltage is larger. More specifically, the level detector 13 includes an inverter gate circuit which receives the integration result signal IR, and sets a logic threshold voltage of this inverter gate circuit to the level determination threshold voltage, compares this level determination threshold voltage and the voltage level of the integration result signal IR, and outputs the level detection signal LDET. This level detector 13 will be described in detail later.

The oscillation control circuit 14 switches a logic level of a clock signal according to the level detection signal LDET. For example, the oscillation control circuit 14 outputs the clock signal by dividing the level detection signal LDET. Further, the oscillation control circuit 14 outputs the charge/discharge control signal CCS to supply to the integrator 12, according to the level detection signal LDET. More specifically, the oscillation control circuit 14 places the charge/discharge control signal CCS for a certain period of time in a state (e.g. a low level) of the signal for instructing the integrator 12 to perform a resetting operation in response to that the logic level of the level detection signal LDET has switched in response to that the integration result signal IR has exceeded the level determination threshold voltage of the level detector 13.

Figure 2:
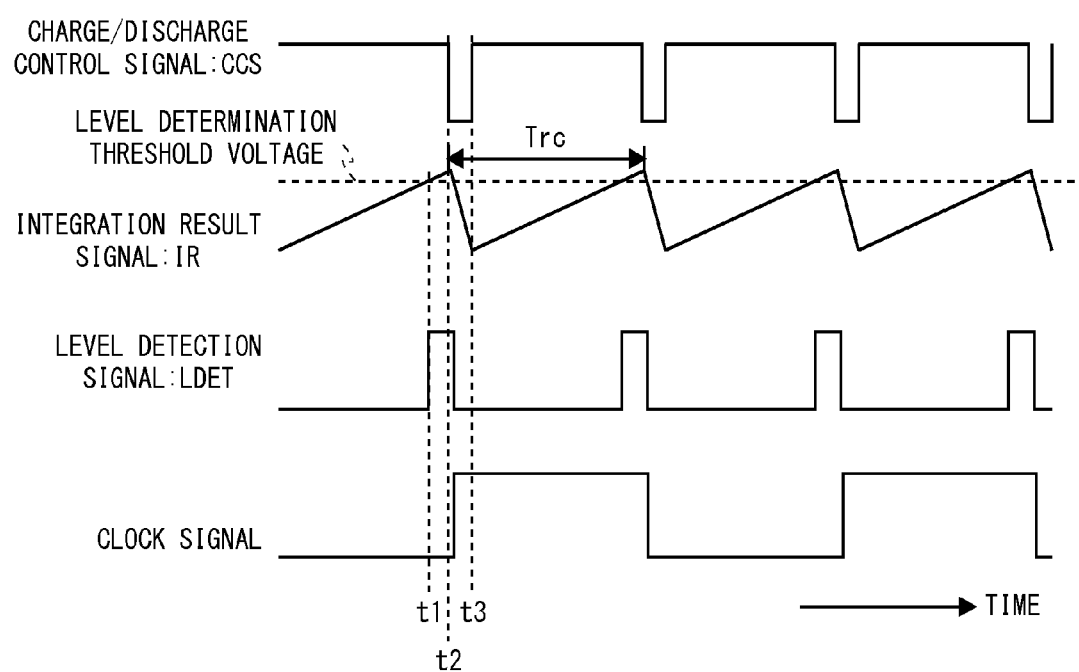
FIG. 2 is a timing chart illustrating an operation of the semiconductor device according to the first embodiment.

Next, an operation of the semiconductor device 1 according to the first embodiment will be described. FIG. 2 is a timing chart illustrating the operation of the semiconductor device 1 according to the first embodiment. As illustrated in FIG. 2, in the semiconductor device 1 according to the first embodiment, when a capacitor in the integrator 12 is charged by the constant current determined based on the bias voltage Vbias generated by the constant current bias voltage generation circuit 11, the voltage level of the integration result signal IR rises.

Further, when the voltage level of the integration result signal IR exceeds the level determination threshold voltage of the level detector 13 at a timing t1, the level detection signal LDET switches from a low level to a high level. Thus, the oscillation control circuit 14 switches the charge/discharge control signal CCS from a high level (e.g. a state for instructing a charging operation) to a low level (e.g. a state for instructing a resetting operation) at a timing t2. Further, in response to the switch of the charge/discharge control signal CCS to the low level, charges which have been charged by the integrator 12 so far are discharged to lower the voltage level of the integration result signal IR. Furthermore, in response to a decrease of the voltage level of the integration result signal IR to the level determination threshold or less as a result of the resetting operation in the integrator 12, the level detector 13 switches the level detection signal LDET from the high level to the low level.

Still further, in an example illustrated in FIG. 2, in response to the switch of the level detection signal LDET to the low level, the oscillation control circuit 14 switches the logic level of the clock signal. In addition, in FIG. 2, the charge/discharge control signal CCS returns to the high level from the low level at a timing t3, and the integrator 12 starts the charging operation again from the timing t3.

The semiconductor device 1 according to the first embodiment determines the frequency of the clock signal based on an interval Trc at which resetting of the integration result signal IR starts. That is, when frequency accuracy of the clock signal is increased in the semiconductor device 1 according to the first embodiment, it is necessary to suppress a variation of the constant current and a variation of the level determination threshold voltage in the integrator 12. Next, the constant current bias voltage generation circuit 11 and inverter gate circuits of the level detectors 13 of the semiconductor device 1 according to the first embodiment will be described.

Figure 3:
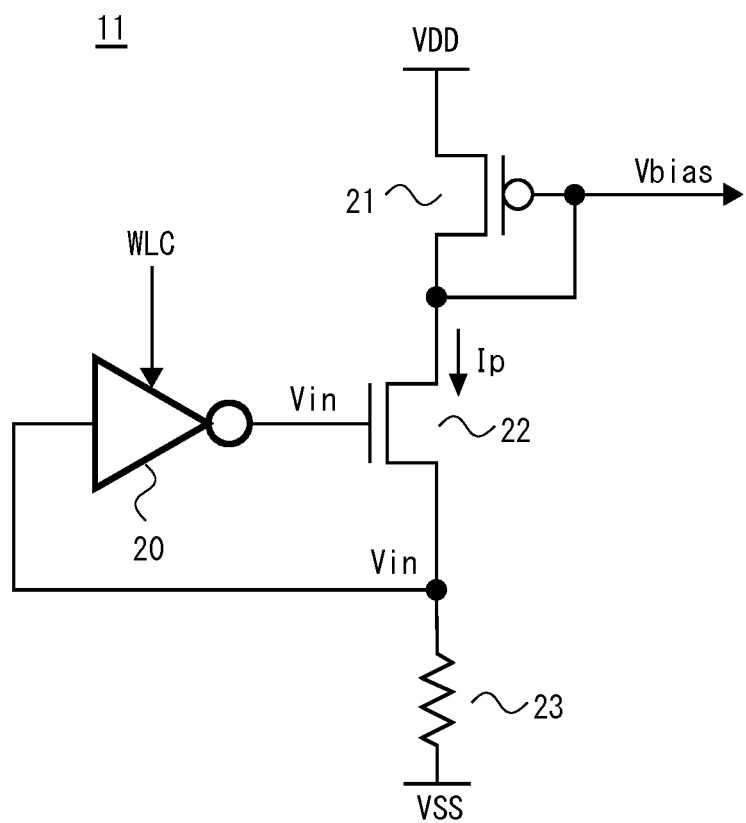
FIG. 3 is a block diagram of a constant current bias voltage generation circuit of the semiconductor device according to the first embodiment.

FIG. 3 is a block diagram of the constant current bias voltage generation circuit 11 according to the first embodiment. As illustrated in FIG. 3, the constant current bias voltage generation circuit 11 includes an inverter gate circuit 20, a PMOS transistor 21, a NMOS transistor 22 and a resistor 23.

The PMOS transistor 21 includes a first terminal (e.g. a source) connected to a first power supply wiring (e.g. a power supply wiring to which a power supply voltage VDD is supplied), and a second terminal (e.g. a drain) connected to a control terminal (e.g. a gate). Further, the PMOS transistor 21 includes the drain connected with a second terminal (e.g. a drain) of the NMOS transistor 22. The resistor 23 is connected between a first terminal (e.g. a source) of the NMOS transistor 22 and a second power supply wiring (e.g. a ground wiring to which a ground voltage VSS is supplied). The inverter gate circuit 20 receives a voltage generated between the resistor 23 and the source of the NMOS transistor 22 as an input signal Vin, and outputs an output signal Vo to a control terminal (e.g. a gate) of the NMOS transistor 22. In addition, the inverter gate circuit 20 receives an input of the WL ratio control signal WLC. The inverter gate circuit 20 switches the ratio of the gate width and the gate length of the internal transistor based on the WL ratio control signal WLC.

In the constant current bias voltage generation circuit 11, the inverter gate circuit 20, the NMOS transistor 22 and the resistor 23 configure a constant current source circuit, and a constant current Ip is generated. Further, when the generated constant current Ip flows to the diode-connected PMOS transistor 21, the bias voltage Vbias is generated at the gate of the PMOS transistor 21. In the semiconductor device 1 according to the first embodiment, the PMOS transistor 21 is a transistor which generates the bias voltage Vbias corresponding to the source current Ip in a current mirror circuit, and a transistor which outputs a branch current corresponding to the bias voltage Vbias in the current mirror circuit is provided in the integrator 12. The semiconductor device 1 controls the frequency of the clock signal based on a charging time for changing the capacitor in the integrator 12 by the constant current generated in the integrator 12 based on the bias voltage Vbias generated by the constant current bias voltage generation circuit 11.

Further, the constant current circuit configured by the inverter gate circuit 20, the NMOS transistor 22 and the resistor 23 is a feedback circuit which controls the constant current Ip such that the voltage of the input signal Vin of the inverter gate circuit 20 becomes a voltage of a logic threshold voltage of the inverter gate circuit 20. Hence, the inverter gate circuit 20 has a problem that a through-current flows in the transistor which configures the inverter gate circuit.

Figure 4:
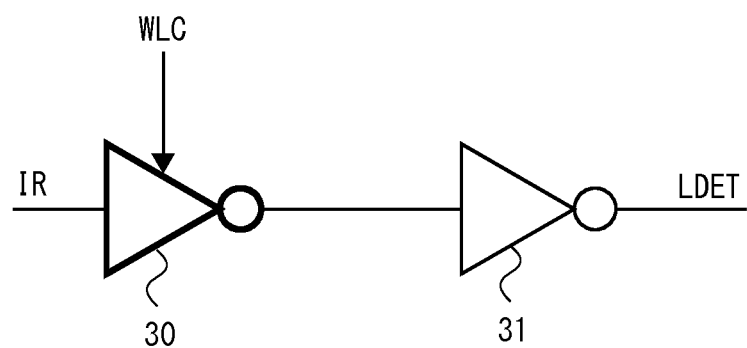
FIG. 4 is a block diagram of a level detector of the semiconductor device according to the first embodiment.

FIG. 4 is a block diagram of the level detector 13 according to the first embodiment. As illustrated in FIG. 4, the level detector 13 includes an inverter gate circuit 30 and an inverter 31. The inverter gate circuit 30 is substantially the same as the inverter gate circuit 20 of the constant current bias voltage generation circuit 11. The level detector 13 sets a logic threshold voltage of the inverter gate circuit 30 as a level determination threshold voltage, and determines the voltage level of the integration result signal IR. The inverter 31 functions as a buffer circuit which transmits an output of the inverter gate circuit 30 to a circuit at a next stage.

Hereinafter, a relationship between logic threshold voltages VTH of the inverter gate circuits of the constant current bias voltage generation circuit 11 and the level detector 13 and the interval Trc indicating a duration of one cycle of the integration result signal IR described with reference to FIG. 2 will be described. In addition, the logic threshold voltages of the inverter gate circuit 20 and the inverter gate circuit 30 are the same in the following description.

First, the constant current Ip which determines a rise rate of the voltage of the integration result signal IR in the semiconductor device 1 according to the first embodiment is given by equation (1). In addition, in equation (1), VTH represents the logic threshold voltage of the inverter gate circuit 20, and R represents a resistance value of the resistor 23.

[Mathematical 1]

$$Ip = VTH/R \quad (1)$$

Next, in the semiconductor device 1 according to the first embodiment, the charging time Trc of the integrator 12 is expressed as in equation (2) according to the logic threshold voltage VTH of the inverter gate circuit 30, the constant current Ip and a capacitance value C of the capacitor in the integrator 12.

[Mathematical 2]

$$Trc = C \cdot VTH/Ip \quad (2)$$

Further, equation (3) is obtained by substituting equation (1) in equation (2).

[Mathematical 3]

$$Trc = C \cdot VTH/(VTH/R) = RC \quad (3)$$

According to equation (1) to equation (3), by matching the logic threshold voltage of the inverter gate circuit 20 in the constant current bias voltage generation circuit 11 and the logic threshold voltage of the inverter gate circuit 30 of the level detector 13, the semiconductor device 1 according to the first embodiment can maintain the duration of the period Trc at a fixed duration irrespectively of variations of the threshold voltages of the transistors, and improve frequency accuracy of a clock signal. However, the inverter gate circuit 20 in the constant current bias voltage generation circuit 11 in particular receives an input of a voltage close to the logic threshold voltage, and therefore a through-current flowing in the transistor which configures the inverter gate circuit causes a problem. Hence, one of features of the semiconductor device 1 according to the first embodiment lies in the inverter gate circuits 20 and 30, so that it is possible to suppress a rise in power consumption caused by the through-current. The inverter gate circuits 20 and 30 will be described in detail below.

Figure 5:
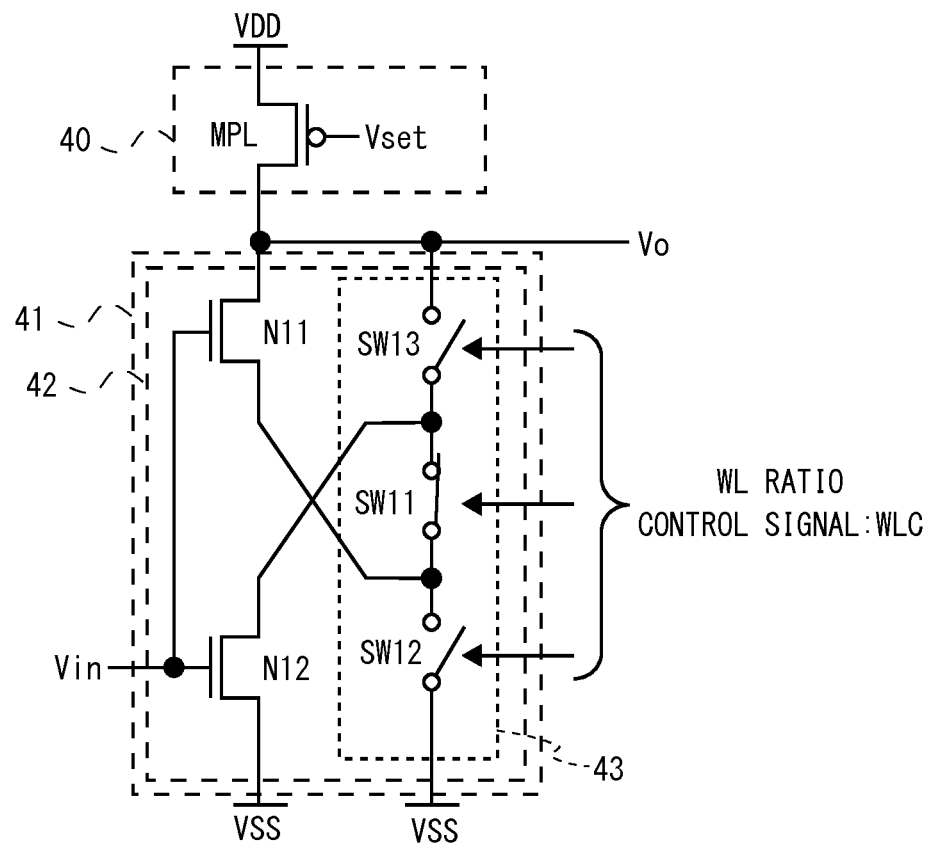
FIG. 5 is a circuit diagram of an inverter gate circuit according to the first embodiment.

FIG. 5 is a circuit diagram of the inverter gate circuit 20 according to the first embodiment. In addition, the same circuit as the inverter gate circuit 20 is used for the inverter gate circuit 30 in the semiconductor device 1 according to the first embodiment, and therefore the inverter gate circuit 20 will be described. First, the inverter gate circuit 20 is a circuit which inverts and outputs a logic level of an input signal. The inverter gate circuit 20 switches an output signal to a low level (e.g. a ground voltage) when a voltage level of an input signal is higher than a logic threshold voltage, and switches an output signal to a high level (e.g. a power supply voltage) when the voltage level of the input signal is lower than the logic threshold voltage. However, when the voltage level of the input signal is close to the logic threshold voltage, the inverter gate circuit 20 outputs the output signal of an intermediate voltage (a voltage between the power supply voltage and the ground voltage) determined based on a resistance ratio of a constant current source 40 and a switch unit 41 described later.

As illustrated in FIG. 5, the inverter gate circuit 20 includes the constant current source 40 and the switch unit 41. The constant current source 40 includes one end connected to the first power supply wiring (e.g. the power supply wiring VDD), and the other end connected to the output terminal (e.g. the output signal Vo as the output terminal). The switch unit 41 is connected between the output terminal and the second power supply wiring (e.g. the ground wiring VSS), and is switched between a conducting state and a blocking state according to the input signal Vin. The switch unit 41 functions as a switch transistor which switches whether to flow a constant current outputted from the constant current source 40 to the ground wiring side or block the constant current. Further, the switch unit 41 has a function of receiving an input of a control signal (e.g. the WL ratio control signal WLC), and switching the W/L ratio of the switch transistor according to the WL ratio control signal WLC.

The constant current source 40 includes a PMOS transistor MPL. The PMOS transistor MPL includes a source connected to the power supply wiring VDD, a drain connected to the output terminal, and a gate which receives an input of a constant voltage Vset. Thus, the PMOS transistor MPL outputs a constant current of a current value corresponding to the voltage level of the constant voltage Vset. In addition, the constant voltage Vset only needs to be a voltage for maintaining a voltage value at a fixed voltage level, and does not necessarily need to be fixed to one voltage value.

The switch unit 41 includes a unit cell 42. Further, the unit cell 42 includes a plurality of transistors whose control terminals receive an input of an input signal, and a connection configuration switch circuit 43. In the inverter gate circuit 20 according to the first embodiment, the unit cell 42 is provided with a first transistor (e.g. a NMOS transistor N11) and a second transistor (e.g. a NMOS transistor N12). The switch unit 41 configures a switch transistor by using one or both of the NMOS transistors N11 and N12. According to the WL ratio control signal WLC, the connection configuration switch circuit 43 switches a current path when a current outputted from the constant current source 40 is applied to one or both of a plurality of NMOS transistors. Thus, real values of a gate length and a gate width of the switch transistors are controlled.

The NMOS transistor N11 includes a first terminal (e.g. a drain) connected to the output terminal, and a control terminal (e.g. a gate) which receives an input of the input signal Vin. Further, a second terminal (e.g. a source) of the NMOS transistor N11 is connected to the connection configuration switch circuit 43. The NMOS transistor N12 includes a second terminal (e.g. a source) connected to the ground wiring VSS, and a control terminal (e.g. a gate) which receives an input of the input signal Vin. The NMOS transistor N12 includes the first terminal (e.g. a drain) connected to the connection configuration switch circuit 43.

The connection configuration switch circuit 43 switches a connection configuration of the NMOS transistors N11 and N12 between the output terminal and the ground wiring VSS according to the WL ratio control signal WLC. The connection configuration switch circuit 43 includes a first switch (e.g. a switch SW11), a second switch (e.g. a switch SW12) and a third switch (e.g. a switch SW13) which are connected in series between the output terminal and the ground wiring VSS and which are switched between the conducting state and the blocking state according to the WL ratio control signal WLC. In addition, on resistances of the switches SW11 to SW13 are set to sufficiently smaller resistances than on resistances of the NMOS transistors N11 and N12.

The switch SW11 includes one end connected to the other end of the switch SW13 and the drain of the NMOS transistor N12, and the other end connected to one end of the switch SW12 and the source of the NMOS transistor N11. The switch SW12 includes one end connected with the other end of the switch SW11 and the source of the NMOS transistor N11, and the other end connected to the ground wiring VSS. The switch SW13 includes one end connected with the output terminal, and the other end connected to the one end of the switch SW11 and the drain of the NMOS transistor N12. Further, in the connection configuration switch circuit 43, when one or two switches of the switches SW11 to SW13 enter the conducting state, the connection configuration of the NMOS transistor N11 and N12 is switched from serial connection to parallel connection between the output terminal and the ground wiring VSS. Further, the connection configuration switch circuit 43 switches the number of NMOS transistors connected between the output terminal and the ground wiring VSS.

In this regard, through-currents in the inverter gate circuit 20 and the inverter gate circuit 30 will be described. In the inverter gate circuits 20 and 30, the voltage level of the input signal Vin at which the constant current outputted from the constant current source 40 and a current Ids applied by the switch transistor configured in the switch unit 41 is the logic threshold voltage. Further, when receiving an input of the input signal Vin which increases the current Ids which can be applied by the switch transistor compared to a current amount of a constant current, the inverter gate circuits 20 and 30 switch the output signal Vo to a low level. That is, in the inverter gate circuits 20 and 30, the constant current outputted from the constant current source 40 takes a maximum value of the through-current.

Hence, the drain current Ids of the switch transistor configured in the switch unit 41 will be described. The drain current Ids of the switch transistor can be expressed as in equation (4). In addition, in equation (4), W represents a gate width of the switch transistor, L represents a gate length of the switch transistor, μ represents a mobility of an electron in a semiconductor, Cox represents a gate oxide film capacitance per unit area, Vgs represents an inter-source/gate voltage of the switch transistor, and Vtn represents a voltage threshold voltage of the switch transistor.

[Mathematical 4]

$$Ids = W/L \cdot (\mu \cdot Cox)/2 \cdot (Vgs - Vtn)^2 \quad (4)$$

Next, the logic threshold voltages VTH of the inverter gate circuits 20 and 30 will be described. The logic threshold voltage VTH is a voltage level of the input signal Vin which is inputted when the drain current Ids of the switch transistor and the constant current outputted from the constant current source 40 substantially match. This logic threshold voltage VIII is expressed as in equation (5). In this regard, Ip represents a current amount of the constant current outputted from the constant current source 40.

[Mathematical 5]

$$VTH = Vtn + \sqrt{(L/W)} \cdot \sqrt{2Ip/\mu Cox} \quad (5)$$

In view of equation (5), the logic threshold voltages VTH of the inverter gate circuits 20 and 30 lower when the W/L ratio is high, and rises when the W/L ratio is low. That is, the inverter gate circuits 20 and 30 can control the logic threshold voltages by changing the W/L ratios of the switch transistors according to the WL ratio control signal WLC. Hence, a modified example of the W/L ratios of the inverter gate circuits 20 and 30 will be described below.

Figure 6:
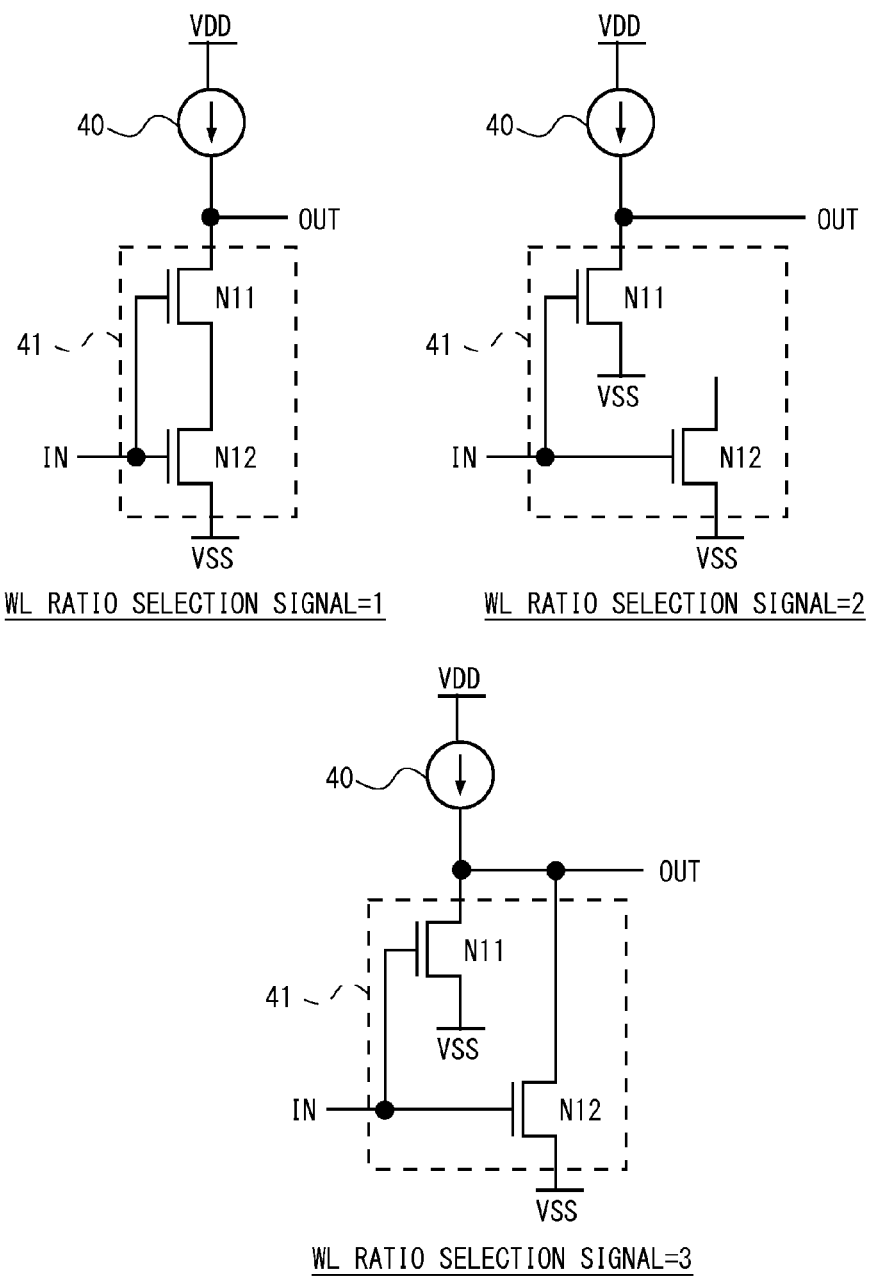
FIG. 6 is a view for explaining types of connection configurations of the inverter gate circuit according to the first embodiment.

FIG. 6 is a view for explaining types of connection configurations of the inverter gate circuit according to the first embodiment. In addition, the W/L ratios of the transistors of the NMOS transistors N11 and N12 are the same. As illustrated in FIG. 6, the inverter gate circuits 20 and 30 according to the first embodiment can select the connection configuration of the transistors in the switch units 41 from three types of connection configurations.

In a first connection configuration (WL ratio selection signal WLSEL=1), the switch SW11 is in an on state, and the switches SW12 and SW13 are in off states. Thus, the connection configuration of the switch units of the inverter gate circuits 20 and 30 is that the NMOS transistors N11 and N12 are connected in series between the output terminal and the ground wiring VSS. That is, in this first connection configuration, the NMOS transistors N11 and N12 connected in series configure the switch transistor. The W/L ratio of this switch transistor is 1/2 fold compared to one NMOS transistor.

In a second connection configuration (WL ratio selection signal WLSEL=2), the switches SW11 and SW13 are in off states, and the switch SW12 is in on state. Thus, the connection configuration of the switch units of the inverter gate circuits 20 and 30 is that only the NMOS transistor N11 is connected between the output terminal and the ground wiring VSS. That is, in this second connection configuration, only the NMOS transistor N11 configures the switch transistor. The W/L ratio of this switch transistor is the same as the W/L ratio in case of one NMOS transistor.

In a third connection configuration (WL ratio selection signal WLSEL=3), the switch SW11 is in an off state, and the switches SW12 and SW13 are in on states. Thus, the connection configuration of the switch units of the inverter gate circuits 20 and 30 is that the NMOS transistors N11 and N12 are connected in parallel between the output terminal and the ground wiring VSS. That is, in this third connection configuration, the NMOS transistors N11 and N12 connected in parallel configure the switch transistor. The W/L ratio of this switch transistor is two fold compared to one NMOS transistor.

Thus, the semiconductor device 1 according to the first embodiment can change the logic threshold voltage of the inverter gate circuit by varying the W/L ratios of the inverter gate circuits 20 and 30.

As described above, in the semiconductor device 1 according to the first embodiment, the inverter gate circuits 20 and 30 are realized by the constant current sources 40 and the switch units 41 connected in series between the power supply wirings VDD and the ground wirings VSS. Thus, the semiconductor device 1 according to the first embodiment can set the current amounts of through-currents flowing in the inverter gate circuits 20 and 30 to current amounts of constant currents outputted from the constant current source 40. Consequently, the semiconductor device 1 according to the first embodiment can reduce the current amounts of the through-currents produced in the inverter gate circuits 20 and 30, and reduce power consumption of the semiconductor device.

Further, the semiconductor device 1 according to the first embodiment provides an effect of suppressing a fluctuation of an oscillation frequency of a clock signal by changing the logic threshold voltages of the inverter gate circuits 20 and 30. Factors that the logic threshold voltages of the inverter gate circuits change include a power supply voltage fluctuation, a temperature fluctuation and a process fluctuation. The power supply voltage fluctuation among these fluctuation factors causes a little changes in the logic threshold voltage, and does not cause a significant influence. However, the temperature fluctuation and the process fluctuation provide great advantages of changing the logic threshold voltages.

More specifically, the process fluctuation lowers the threshold voltage of the NMOS transistor and then the semiconductor device of the low logic threshold voltage is manufactured, or the semiconductor device is placed in a high temperature state and therefore the threshold voltage of the NMOS transistor lowers and the logic threshold voltage lowers. In such a case, the delay amount increases in the inverter gate circuit 30, and the oscillation frequency shifts. This is because an oscillation cycle is formulated in equations (1) to (3) assuming that the charging time Trc of the integrator is determined. However, actually, the oscillation cycle includes not only the charging time Trc but also a delay time of the level detector. When the logic threshold voltage VTH is extremely low, the delay time of the level detector becomes evident, and, as a result, oscillation accuracy deteriorates.

Further, when a process fluctuation raises the threshold voltage of the NMOS transistor and a semiconductor device of a high logic threshold voltage is manufactured, or a semiconductor device is placed in a low temperature state and therefore the threshold voltage of the NMOS transistor rises and the logic threshold voltage becomes high. In such a case, through-currents increase in the inverter gate circuits 20 and 30, and power consumption of the semiconductor device 1 increases.

Figure 7:
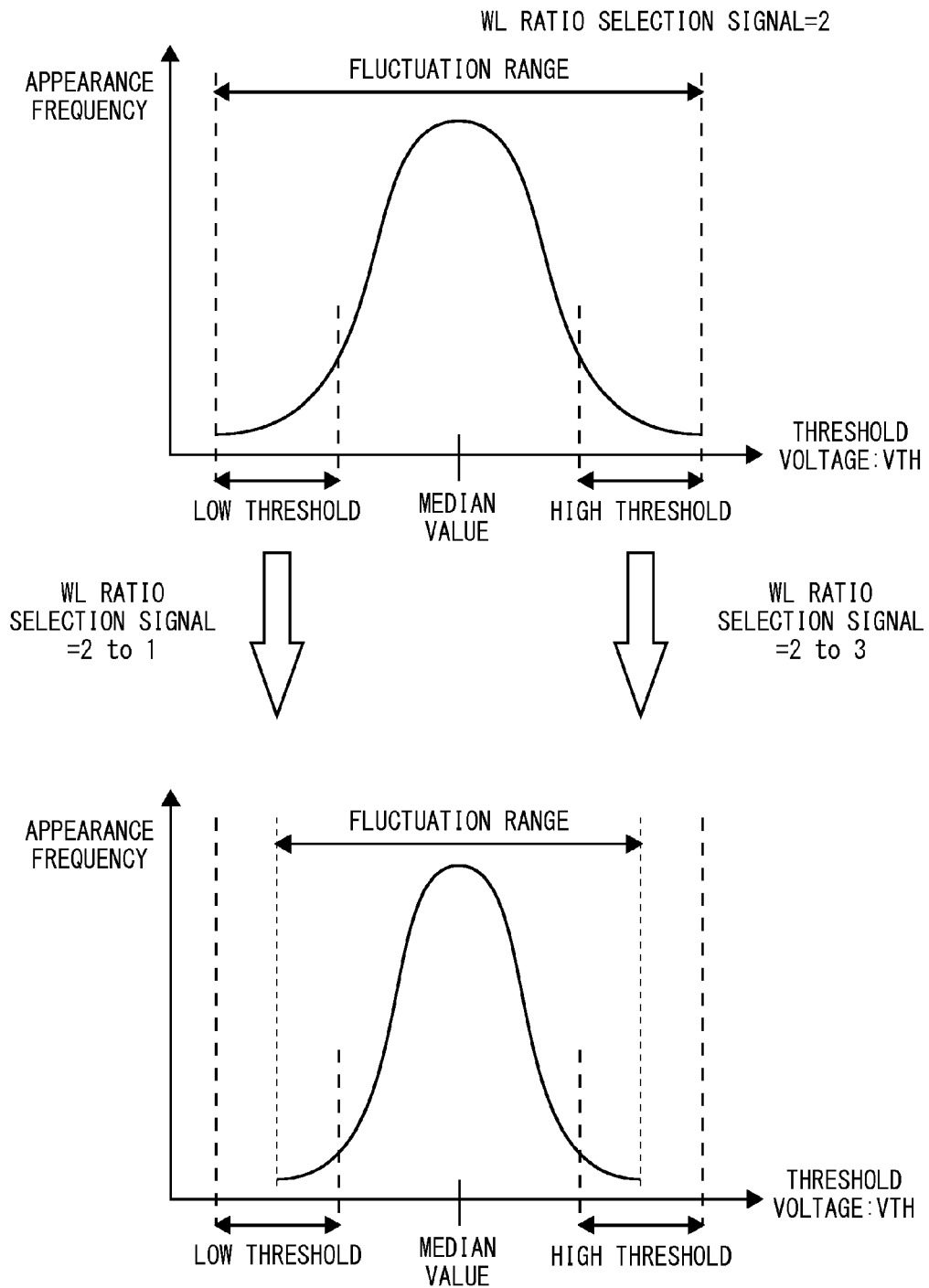
FIG. 7 is a view for explaining a variation of a logic threshold voltage of the semiconductor device according to the first embodiment.

However, the semiconductor device 1 according to the first embodiment can suppress the above-described frequency shift and an increase in power consumption by adequately manipulating the logic threshold voltages of the inverter gate circuits 20 and 30. FIG. 7 is a view for explaining a variation of a logic threshold voltage of the semiconductor device 1 according to the first embodiment. Graphs illustrated in FIG. 7 are converted from appearance frequencies of logic threshold voltages of multiple semiconductor devices. The upper graph in FIG. 7 indicates that logic threshold voltages are not manipulated. As illustrated in the upper graph in this FIG. 7, logic threshold voltages of the inverter gate circuits are close to a median value yet take low threshold voltages or high threshold voltages shifted from the median value. Then, the low logic threshold voltages are increased by changing the WL ratio selection signals WLSEL from 2 to 1 and changing the W/L ratio of switch units from a 1-fold W/L ratio to a 1/2-fold W/L ratio. Further, the high logic threshold voltages are lowered by changing the WL ratio selection signals WLSEL from 2 to 3 and changing the W/L ratios of switch units from a 1-fold W/L ratio to a 2-fold W/L ratio. By performing this manipulation, it is possible to reduce a fluctuation range of the logic threshold voltage VTH.

Consequently, the semiconductor device 1 according to the first embodiment can minimize an oscillation frequency shift caused by a temperature fluctuation and a process fluctuation of threshold voltages of transistors, and suppress power consumption by manipulating the logic threshold voltages VTH of the inverter gate circuits.

Second Embodiment

Inverter gate circuits 20a and 30a which adopt another embodiment of inverter gates will be described in the second embodiment. In addition, the inverter gate circuits 20a and 30a are substantially the same circuits, and therefore the inverter gate circuit 20a will be described below. Further, components described in the first embodiment will be assigned the same reference numerals as those in the first embodiment and will not be described.

Figure 8:
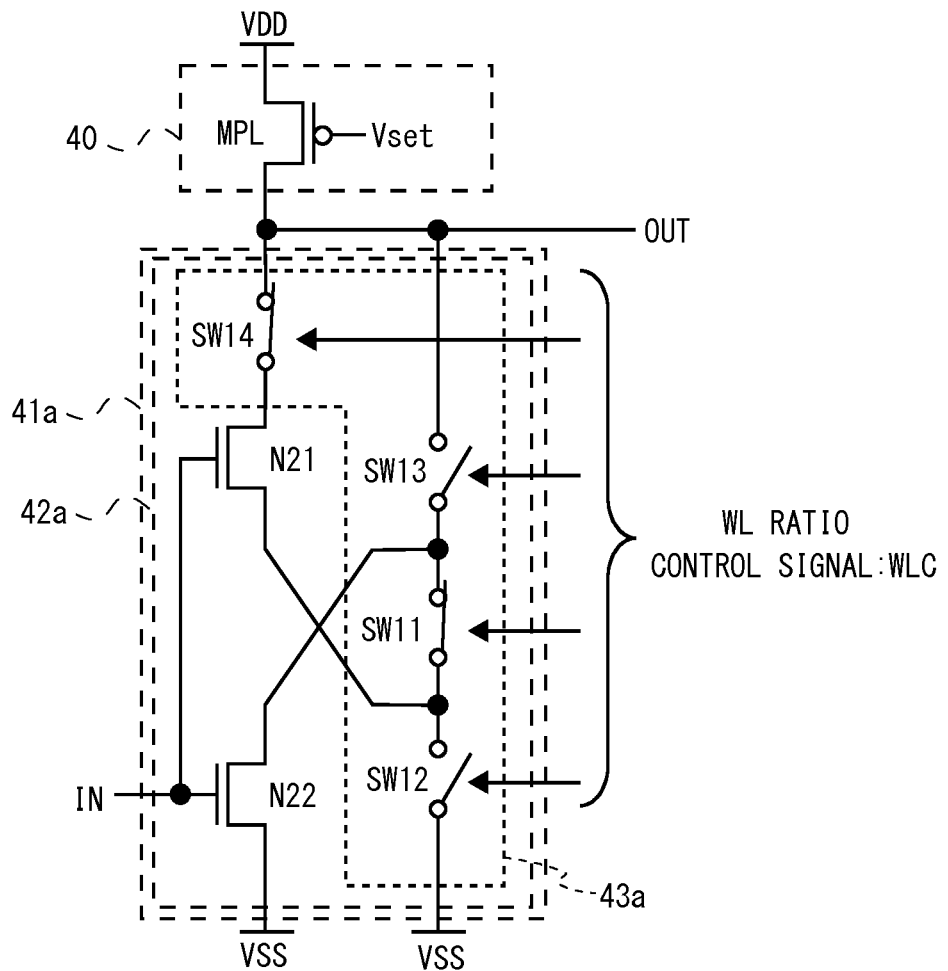
FIG. 8 is a block diagram of an inverter gate circuit according to a second embodiment.

FIG. 8 is a circuit diagram of the inverter gate circuit 20a according to the second embodiment. As illustrated in FIG. 8, the inverter gate circuit 20a employs a configuration where a switch unit 41 of an inverter gate circuit 20 is replaced with a switch unit 41a. In the switch unit 41a, a connection configuration switch circuit 43 is replaced with a connection configuration switch circuit 43a.

The connection configuration switch circuit 43a employs a configuration where a fourth switch (e.g. a switch SW14) is added to the connection configuration switch circuit 43. The switch SW14 is connected between a first terminal (e.g. a drain) of a first transistor (e.g. a NMOS transistor N21) and an output terminal. Open/close states of this switch SW14 are controlled according to a control signal (e.g. a WL ratio control signal WLC) similar to switches SW11 to SW13.

Further, similar to the switch unit 41, the switch unit 41a includes a first transistor (e.g. the NMOS transistor N21) and a second transistor (e.g. a NMOS transistor N22). In the switch unit 41, W/L ratios of the two transistors are set to the same ratio. However, the NMOS transistors N21 and N22 are transistors of different W/L ratios. For example, the W/L ratio of the NMOS transistor N21 is set to a 1.5-fold W/L ratio compared to that of the NMOS transistor N22.

Similar to the inverter gate circuit 20, this inverter gate circuit 20a can change the W/L ratio of the switch transistor configured in the switch unit 41a according to the WL ratio control signal WLC. FIG. 9 is a view for explaining types of connection configurations of the inverter gate circuit 20a according to the second embodiment. In addition, FIG. 9 illustrates that "+" indicates a state where transistors are connected in series and "||" indicates a state where transistors are connected in parallel.

As illustrated in FIG. 9, the inverter gate circuits 20a can adopt four types of connection configurations. In a first connection configuration (WL ratio selection signal WLSEL=1), the switches SW11 and SW14 are in on states, and switches SW12 and SW13 are in off states. Thus, the connection configuration of the switch unit of the inverter gate circuit 20a is that the NMOS transistors N11 and N12 are connected in series between the output terminal and a ground wiring VSS. That is, in this first connection configuration, the NMOS transistors N11 and N12 connected in series configure the switch transistor. The W/L ratio of this switch transistor is 0.6 fold compared to when the W/L ratio of the NMOS transistor N11 is 1 fold.

In a second connection configuration (WL ratio selection signal WLSEL=2), the switches SW11 and SW13 are in off states, and the switches SW12 and SW14 are in on states. Thus, the connection configuration of the switch unit of the inverter gate circuit 20a is that only the NMOS transistor N11 is connected between the output terminal and the ground wiring VSS. That is, in this second connection configuration, only the NMOS transistor N11 configures the switch transistor. The W/L ratio of this switch transistor is 1 fold which is the W/L ratio of the NMOS transistor N11.

In a third connection configuration (WL ratio selection signal WLSEL=3), the switches SW11 and SW14 are in off states, and the switches SW12 and SW13 are in on states. In addition, in this third connection configuration, the open/close state of the switch SW12 may be the on state or the off state. Thus, the connection configuration of the switch unit of the inverter gate circuit 20 is that only the NMOS transistor N12 is connected between the output terminal and the ground wiring VSS. That is, in this third connection configuration, only the NMOS transistor N12 configures the switch transistor. The W/L ratio of this switch transistor is 1.5 fold which is the W/L ratio of the NMOS transistor N12.

In a fourth connection configuration (WL ratio selection signal WLSEL=4), the switch SW11 is in an off state, and the switches SW12, SW13 and SW14 are in on states. Thus, the connection configuration of the switch unit of the inverter gate circuit 20a is that the NMOS transistors N11 and N12 are connected in parallel between the output terminal and the ground wiring VSS. That is, in this fourth connection configuration, the NMOS transistors N11 and N12 connected in parallel configure the switch transistor. The W/L ratio of this switch transistor is 2.5 fold compared to when the W/L ratio of the NMOS transistor N11 is 1 fold.

As described above, the semiconductor device which uses the inverter gate circuit 20a according to the second embodiment has a wider variable range of W/L ratios of switch transistors configured in switch units compared to that of the semiconductor device which uses the inverter gate circuit 20 according to the first embodiment. Thus, the semiconductor device according to the second embodiment provides a higher effect of reducing power consumption and a higher effect of improving oscillation accuracy than those of the semiconductor device according to the first embodiment.

Third Embodiment

Inverter gate circuits 20b and 30b which adopt another embodiment of inverter gate circuits will be described in the third embodiment. In addition, the inverter gate circuits 20a and 30a are substantially the same circuits, and therefore the inverter gate circuit 20a will be described below. Further, components described in the first embodiment will be assigned the same reference numerals as those in the first embodiment and will not be described.

Figure 10:
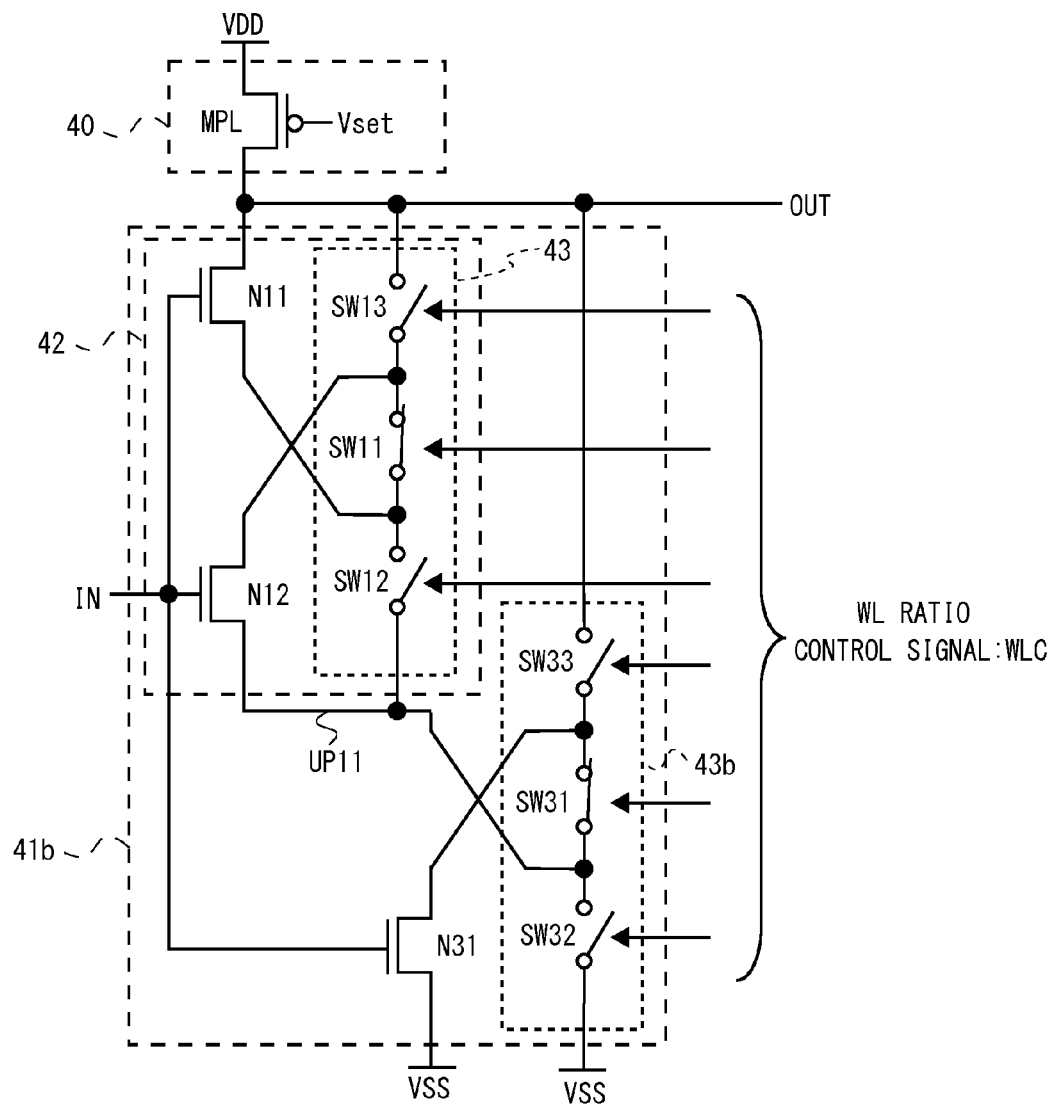
FIG. 10 is a circuit diagram of an inverter gate circuit according to a third embodiment.

FIG. 10 is a circuit diagram of the inverter gate circuit 20a according to the third embodiment. As illustrated in FIG. 10, the inverter gate circuit 20b according to third embodiment includes a switch unit 41b instead of a switch unit 41. The switch unit 41b includes a unit cell 42 and, in addition, a third transistor (e.g. a NMOS transistor N31) and a second connection configuration switch circuit (e.g. a connection configuration switch circuit 43b). Further, in the inverter gate circuit 20b, the unit cell 42 is provided between an intra-unit power supply wiring UP11 and an output terminal. In addition, the third embodiment will be described assuming that a connection configuration switch circuit 43 is a first connection configuration switch circuit. Further, in the third embodiment, the W/L ratios of NMOS transistors N11, N12 and N31 are the same.

The NMOS transistor N31 includes a second terminal (e.g. a source) connected to a ground wiring VSS, and a first terminal (e.g. a drain) connected to the connection configuration switch circuit 43b. The connection configuration switch circuit 43b is provided between the output terminal and the ground wiring VSS. Further, the connection configuration switch circuit 43b switches a connection configuration of the unit cell 42 and the NMOS transistor N31 between the output terminal and the ground wiring VSS according to a control signal (e.g. a WL ratio control signal WLC).

The connection configuration switch circuit 43b includes a fourth switch (e.g. a switch SW31), a fifth switch (e.g. a switch SW32) and a sixth switch (switch SW33) which are connected in series between the output terminal and the ground wiring VSS, and are switched between conducting states and blocking states according to the WL ratio control signal WLC. The switch SW31 includes one end connected to the other end of the switch SW33 and a drain of the NMOS transistor N31, and the other end connected to one end of the switch SW32 and the intra-unit power supply wiring UP11. The switch SW32 includes one end connected to the other end of the switch SW31 and the intra-unit power supply wiring UP11, and the other end connected to the ground wiring VSS. The switch SW33 includes one end connected with the output terminal, and the other end connected to one end of the switch SW31 and the drain of the NMOS transistor N31.

Similar to the inverter gate circuit 20, this inverter gate circuit 20b can change the W/L ratio of a switch transistor configured in the switch unit 41b according to the WL ratio control signal WLC. FIG. 11 is a view for explaining types of connection configurations of the inverter gate circuits 20b according to the third embodiment.

As illustrated in FIG. 11, the inverter gate circuit 20b adopts seven types of connection configurations. In a first connection configuration (WL ratio selection signal WLSEL=1), switches SW11 and SW31 are in on states, and the other switches are in off states. Thus, the connection configuration of the switch unit of the inverter gate circuit 20b is that the NMOS transistors N11, N12 and N31 are connected in series between the output terminal and the ground wiring VSS. That is, in this first connection configuration, the NMOS transistors N11, N12 and N31 connected in series configure the switch transistor. The W/L ratio of this switch transistor is 1/3 fold compared to when one NMOS transistor configures the switch transistor.

In a second connection configuration (WL ratio selection signal WLSEL=2), switches SW12 and SW31 are in on states, and the other switches are in off states. Thus, the connection configuration of the switch unit of the inverter gate circuit 20b is that the NMOS transistors N11 and N31 are connected in series between the output terminal and the ground wiring VSS. That is, in this second connection configuration, the NMOS transistors N11 and N31 configure the switch transistor. The W/L ratio of this switch transistor is 1/2 fold compared to when one NMOS transistor configures the switch transistor.

In a third connection configuration (WL ratio selection signal WLSEL=3), switches SW12, SW13 and SW31 are in on states, and the other switches are in off states. Thus, the connection configuration of the switch unit of the inverter gate circuit 20b is that the NMOS transistors N11 and N12 are connected in parallel between the output terminal and the ground wiring VSS, and the NMOS transistor N31 is connected in series to the transistors connected in parallel. That is, in this third connection configuration, the NMOS transistors N11, N12 and N31 configure the switch transistor. The W/L ratio of this switch transistor is 2/3 fold compared to when one NMOS transistor configures the switch transistor.

In a fourth connection configuration (WL ratio selection signal WLSEL=4), the switches SW12 and SW32 are in on states, and the other switches are in off states. Thus, the connection configuration of the switch unit of the inverter gate circuit 20b is that only the NMOS transistor N11 is connected between the output terminal and the ground wiring VSS. That is, in this fourth connection configuration, only the NMOS transistor N11 configures the switch transistor. The W/L ratio of this switch transistor is the same 1 fold as that in case where one NMOS transistor configures the switch transistor.

In a fifth connection configuration (WL ratio selection signal WLSEL=5), the switches SW11, SW32 and SW33 are in on states, and the other switches are in off states. Thus, the connection configuration of the switch unit of the inverter gate circuit 20b is that the NMOS transistors N11 and N12 are connected in series between the output terminal and the ground wiring VSS, and the NMOS transistor N31 is connected in parallel to the transistors connected in series. That is, in this fifth connection configuration, the NMOS transistors N11, N12 and N31 configure the switch transistors. The W/L ratio of this switch transistor is 3/2 fold compared to when one NMOS transistor configures the switch transistor.

In a sixth connection configuration (WL ratio selection signal WLSEL=6), the switches SW12, SW32 and SW33 are in on states, and the other switches are in off states. Thus, the connection configuration of the switch unit of the inverter gate circuit 20b is that the NMOS transistors N11 and N31 are connected in parallel between the output terminal and the ground wiring VSS. That is, in this sixth connection configuration, the NMOS transistors N11 and N31 configure the switch transistor. The W/L ratio of this switch transistor is 2 fold compared to when one NMOS transistor configures the switch transistor.

In a seventh connection configuration (WL ratio selection signal WLSEL=7), the switches SW12, SW13, SW32 and SW33 are in on states, and the other switches are in off states. Thus, the connection configuration of the switch unit of the inverter gate circuit 20b is that the NMOS transistors N11, N12 and N31 are connected in parallel between the output terminal and the ground wiring VSS. That is, in this seventh connection configuration, the NMOS transistors N11, N12 and N31 configure the switch transistor. The W/L ratio of this switch transistor is 3 fold compared to when one NMOS transistor configures the switch transistor.

As described above, the semiconductor device which uses the inverter gate circuit 20b according to the third embodiment has a wider variable range of W/L ratios of switch transistors configured in switch units compared to that of the semiconductor device which uses the inverter gate circuit 20 according to the first embodiment. Thus, the semiconductor device according to the third embodiment provides a higher effect of reducing power consumption and a higher effect of improving oscillation accuracy than the semiconductor device according to the first embodiment.

Fourth Embodiment

Inverter gate circuits 20c and 30c which adopt another embodiment of inverter gates will be described in the fourth embodiment. In addition, the inverter gate circuits 20c and 30c are substantially the same circuits, and therefore the inverter gate circuit 20c will be described below. Further, components described in the first and third embodiments will be assigned the same reference numerals as those in the first and third embodiments and will not be described.

Figure 12:
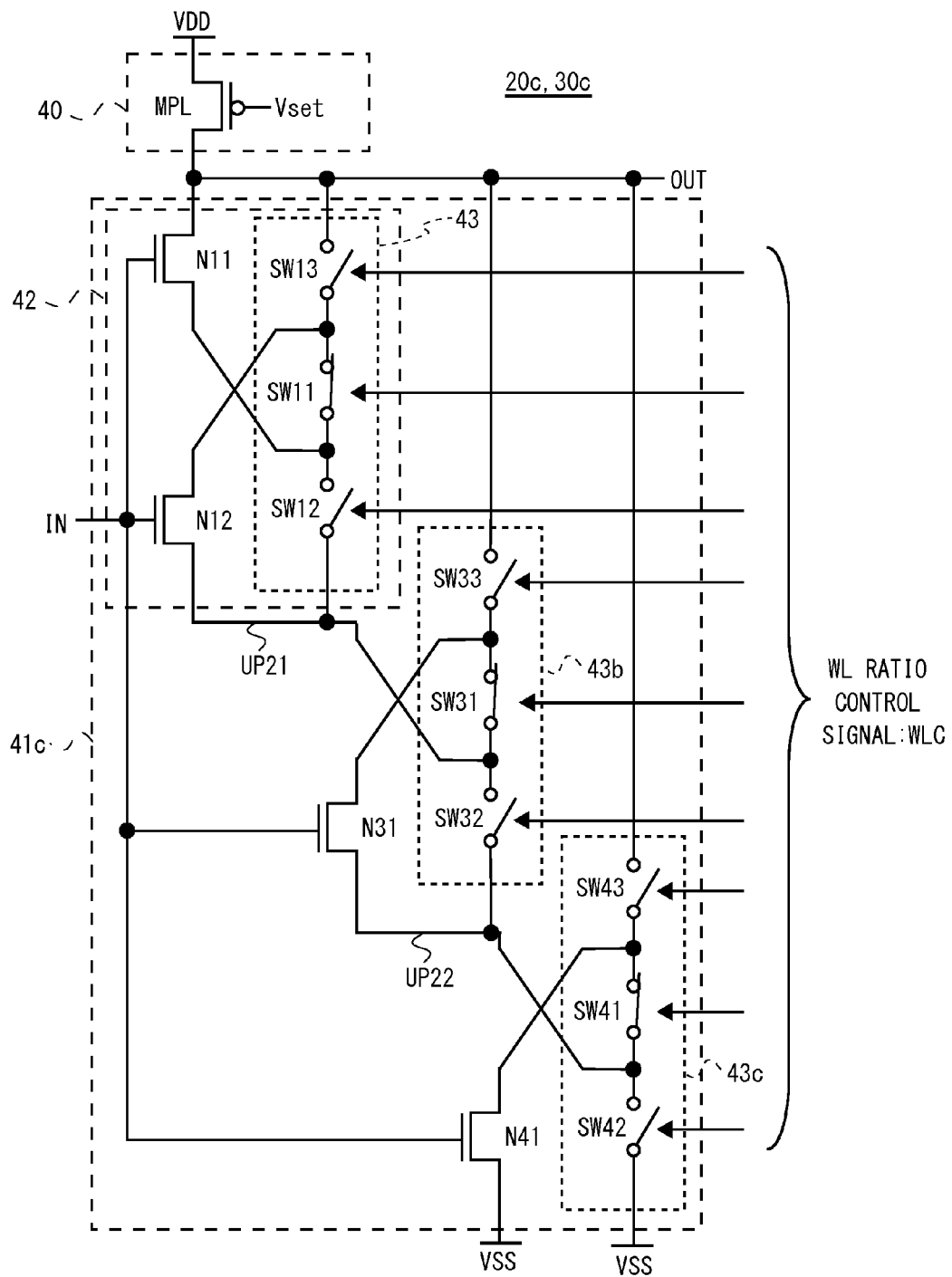
FIG. 12 is a circuit diagram of an inverter gate circuit according to a fourth embodiment.

FIG. 12 is a circuit diagram of the inverter gate circuit 20c according to the fourth embodiment. As illustrated in FIG. 12, the inverter gate circuit 20c according to the fourth embodiment includes a switch unit 41c instead of a switch unit 41b. The switch unit 41c includes the switch unit 41b and, in addition, a fourth transistor (e.g. a NMOS transistor N41) and a third connection configuration switch circuit (e.g. a connection configuration switch circuit 43c). Further, in the inverter gate circuit 20c, a unit cell 42 is provided between a first intra-unit power supply wiring UP21 and an output terminal, and a connection configuration switch circuit 43b is provided between a second intra-unit power supply wiring UP22 and the output terminal, and a source of a NMOS transistor N31 is connected to the second intra-unit power supply wiring UP21. In addition, the fourth embodiment will be described assuming that a connection configuration switch circuit 43 is a first connection configuration switch circuit. Further, in the fourth embodiment, W/L ratios of NMOS transistors N11, N12, N31 and N41 are the same.

The NMOS transistor N41 includes a second terminal (e.g. a source) connected to a ground wiring VSS, and a first terminal (e.g. a drain) connected to the connection configuration switch circuit 43c. The connection configuration switch circuit 43c is provided between the output terminal and the ground wiring VSS. Further, the connection configuration switch circuit 43c switches a connection configuration of the NMOS transistor N41 and a switch unit configured by the unit cell 42 and the NMOS transistor N31 between the output terminal and the ground wiring VSS according to a control signal (e.g. a WL ratio control signal WLC).

The connection configuration switch circuit 43c includes a seventh switch (e.g. a switch SW41), an eighth switch (e.g. a switch SW42) and a ninth switch (switch SW43) which are connected in series between the output terminal and the ground wiring VSS, and are switched between conducting states and blocking states according to the WL ratio control signal WLC. The switch SW41 includes one end connected with the other end of the switch SW43 and a drain of the NMOS transistor N41, and the other end connected to one end of the switch SW42 and the intra-unit power supply wiring UP22. The switch SW42 includes one end connected with the other end of the switch SW41 and the intra-unit power supply wiring UP22, and the other end connected to the ground wiring VSS. The switch SW43 includes one end connected with the output terminal, and the other end connected to one end of the switch SW41 and the drain of the NMOS transistor N41.

Similar to the inverter gate circuit 20, this inverter gate circuit 20c can change the W/L ratio of the switch transistor configured in the switch unit 41c according to the WL ratio control signal WLC. FIG. 13 is a view illustrating types of connection configurations of the inverter gate circuit 20c according to the fourth embodiment.

As illustrated in FIG. 13, the inverter gate circuit 20c adopts 15 types of connection configurations. In a first connection configuration (WL ratio selection signal WLSEL=1), switches SW11, SW31 and SW41 are in on states, and the other switches are in off states. Thus, the connection configuration of the switch unit of the inverter gate circuit 20c is that NMOS transistors N11, N12, N31 and N41 are connected in series between the output terminal and the ground wiring VSS. That is, in this first connection configuration, the NMOS transistors N11, N12, N31 and N41 connected in series configure the switch transistor. The W/L ratio of this switch transistor is 1/4 fold compared to when one NMOS transistor configures the switch transistor.

In a second connection configuration (WL ratio selection signal WLSEL=2), switches SW12, SW31 and SW41 are in on states, and the other switches are in off states. Thus, the connection configuration of the switch unit of the inverter gate circuit 20c is that the NMOS transistors N11, N31 and N41 are connected in series between the output terminal and the ground wiring VSS. That is, in this second connection configuration, the NMOS transistors N11, N31 and N41 configure the switch transistor. The W/L ratio of this switch transistor is 1/3 fold compared to when one NMOS transistor configures the switch transistor.

In a third connection configuration (WL ratio selection signal WLSEL=3), switches SW12, SW13, SW31 and SW41 are in on states, and the other switches are in off states. Thus, the connection configuration of the switch unit of the inverter gate circuit 20c is that the NMOS transistors N11 and N12 are connected in parallel between the output terminal and the ground wiring VSS, and the NMOS transistors N31 and N41 are connected in series to the transistors connected in parallel. That is, in this third connection configuration, the NMOS transistors N11, N12, N31 and N41 configure the switch transistor. The W/L ratio of this switch transistor is 2/5 fold compared to when one NMOS transistor configures the switch transistor.

In a fourth connection configuration (WL ratio selection signal WLSEL=4), switches SW12, SW32 and SW41 are in on states, and the other switches are in off states. Thus, the connection configuration of the switch unit of the inverter gate circuit 20c is that the NMOS transistors N11 and N41 are connected in series between the output terminal and the ground wiring VSS. That is, in this fourth connection configuration, the NMOS transistors N11 and N41 configure the switch transistor. The W/L ratio of this switch transistor is 1/2 fold compared to when one NMOS transistor configures the switch transistor.

In a fifth connection configuration (WL ratio selection signal WLSEL=5), switches SW11, SW32, SW33 and SW41 are in on states, and the other switches are in off states. Thus, the connection of the switch unit of the inverter gate circuit 20c is that the NMOS transistors N11 and N12 are connected in series between the output terminal and the ground wiring VSS, the NMOS transistor N31 is connected in parallel to the NMOS transistors N11 and N12 connected in series, and the NMOS transistor N41 is connected in series to the NMOS transistors N11, N12 and N13. That is, in this fifth connection configuration, the NMOS transistors N11, N12, N31 and N41 configure the switch transistor. The W/L ratio of this switch transistor is 3/5 fold compared to when one NMOS transistor configures the switch transistor.

In a sixth connection configuration (WL ratio selection signal WLSEL=6), the switches SW12, SW32, SW33 and SW41 are in on states, and the other switches are in off states. Thus, the connection configuration of the switch unit of the inverter gate circuit 20c is that the NMOS transistors N11 and N31 are connected in parallel between the output terminal and the ground wiring VSS, and the NMOS transistor N41 is connected in series to the NMOS transistors N11 and N31 connected in parallel. That is, in this sixth connection configuration, the NMOS transistors N11, N12 and N41 configure the switch transistor. The W/L ratio of this switch transistor is 2/3 fold compared to when one NMOS transistor configures the switch transistor.

In a seventh connection configuration (WL ratio selection signal WLSEL=7), the switches SW12, SW13, SW32, SW33 and SW41 are in on states, and the other switches are in off states. Thus, the connection configuration of the switch unit of the inverter gate circuit 20c is that the NMOS transistors N11, N12 and N31 are connected in parallel between the output terminal and the ground wiring VSS, and the NMOS transistor N41 is connected in series to the NMOS transistors N11, N12 and N31 connected in parallel. That is, in this seventh connection configuration, the NMOS transistors N11, N12, N31 and N41 configure the switch transistor. The W/L ratio of this switch transistor is 3/4 fold compared to when one NMOS transistor configures the switch transistor.

In an eighth connection configuration (WL ratio selection signal WLSEL=8), the switches SW12, SW32 and SW42 are in on states, and the other switches are in the off states. Thus, the connection configuration of the switch unit of the inverter gate circuit 20c is that only the NMOS transistor N11 is connected between the output terminal and the ground wiring VSS. That is, in this eighth connection configuration, the NMOS transistor N11 configures the switch transistor. The W/L ratio of this switch transistor is 1 fold compared to when one NMOS transistor configures the switch transistor.

In a ninth connection configuration (WL ratio selection signal WLSEL=9), the switches SW11, SW31, SW42 and SW43 are in on states, and the other switches are in off states. Thus, the connection configuration of the switch unit of the inverter gate circuit 20c is that the NMOS transistors N11, N12 and N31 are connected in series between the output terminal and the ground wiring VSS, and the NMOS transistor N41 is connected in parallel to the transistors connected in series. That is, in the ninth connection configuration, the NMOS transistors N11, N12, N31 and N41 configure the switch transistor. The W/L ratio of this switch transistor is 4/3 fold compared to when one NMOS transistor configures the switch transistor.

In a tenth connection configuration (WL ratio selection signal WLSEL=10), the switches SW12, SW31, SW42 and SW43 are in on states, and the other switches are in off states. Thus, the connection configuration of the switch unit of the inverter gate circuit 20c is that the NMOS transistors N11, N31 and N41 are connected in parallel between the output terminal and the ground wiring VSS. That is, in this tenth connection configuration, the NMOS transistors N11, N31 and N31 configure the switch transistor. The W/L ratio of this switch transistor is 3/2 fold compared to when one NMOS transistor configures the switch transistor.

In an eleventh connection configuration (WL ratio selection signal WLSEL=11), switches SW12, SW13, SW31, SW42 and SW43 are in on states, and the other switches are in off states. Thus, the connection configuration of the switch unit of the inverter gate circuit 20c is that the NMOS transistors N11 and N12 are connected in parallel between the output terminal and the ground wiring VSS, the NMOS transistor N31 is connected in series to the NMOS transistors N11 and N12 connected in parallel, and the NMOS transistor N41 is connected in parallel to the NMOS transistors N11, N12 and N13. That is, in this eleventh connection configuration, the NMOS transistors N11, N12, N31 and N41 configure the switch transistor. The W/L ratio of this switch transistor is 5/3 fold compared to when one NMOS transistor configures the switch transistor.

In a twelfth connection configuration (WL ratio selection signal WLSEL=12), the switches SW12, SW32, SW42 and SW43 are in on states, and the other switches are in off states. Thus, the connection configuration of the switch unit of the inverter gate circuit 20c is that the NMOS transistors N11 and N41 are connected in parallel between the output terminal and the ground wiring VSS. That is, in this twelfth connection configuration, the NMOS transistors N11 and N41 configure the switch transistor. The W/L ratio of this switch transistor is 2 fold compared to when one NMOS transistor configures the switch transistor.

In a thirteenth connection configuration (WL ratio selection signal WLSEL=13), the switches SW11, SW32, SW33, SW42 and SW43 are in on states, and the other switches are in the off states. Thus, the connection configuration of the switch unit of the inverter gate circuit 20c is that the NMOS transistors N11 and N12 are connected in series between the output terminal and the ground wiring VSS, and the NMOS transistor N31 and the NMOS transistor N41 are connected in parallel to the NMOS transistors N11 and N12 connected in series. That is, in this thirteenth connection configuration, the NMOS transistors N11, N12, N31 and N41 configure the switch transistor. The W/L ratio of this switch transistor is 5/2 fold compared to when one NMOS transistor configures the switch transistor.

In a fourteenth connection configuration (WL ratio selection signal WLSEL=14), the switches SW12, SW32, SW33, SW42 and SW43 are in on states, and the other switches are in off states. Thus, the connection configuration of the switch unit of the inverter gate circuit 20c is that the NMOS transistors N11, N31 and N41 are connected in parallel between the output terminal and the ground wiring VSS. That is, in this fourteenth connection configuration, the NMOS transistors N11, N31 and N41 configure the switch transistor. The W/L ratio of this switch transistor is 3 fold compared to when one NMOS transistor configures the switch transistor.

In a fifteenth connection configuration (WL ratio selection signal WLSEL=15), the switches SW12, SW13, SW32, SW33, SW42 and SW43 are in on states, and the other switches are in off states. Thus, the connection configuration of the switch unit of the inverter gate circuit 20c is that the NMOS transistors N11, N12, N31 and N41 are connected in parallel between the output terminal and the ground wiring VSS. That is, in this fourteenth connection configuration, the NMOS transistors N11, N12, N31 and N41 configure the switch transistor. The W/L ratio of this switch transistor is 4 fold compared to when one NMOS transistor configures the switch transistor.

As described above, the semiconductor device which uses the inverter gate circuit 20c according to the fourth embodiment has a wider variable range of the W/L ratios of the switch transistors configured in the switch units, and includes more variable steps compared to the semiconductor device which uses the inverter gate circuit 20 according to the first embodiment. Thus, the semiconductor device according to the fourth embodiment provides a higher effect of reducing power consumption and a higher effect of improving oscillation accuracy than the semiconductor device according to the first embodiment.

Fifth Embodiment

Inverter gate circuits 20d and 30d which adopt another embodiment of inverter gate circuits will be described in the fifth embodiment. In addition, the inverter gate circuits 20d and 30D are substantially the same circuits, and therefore the inverter gate circuit 20d will be described below. Further, components described in the first and third embodiments will be assigned the same reference numerals as those in the first embodiment and will not be described.

Figure 14:
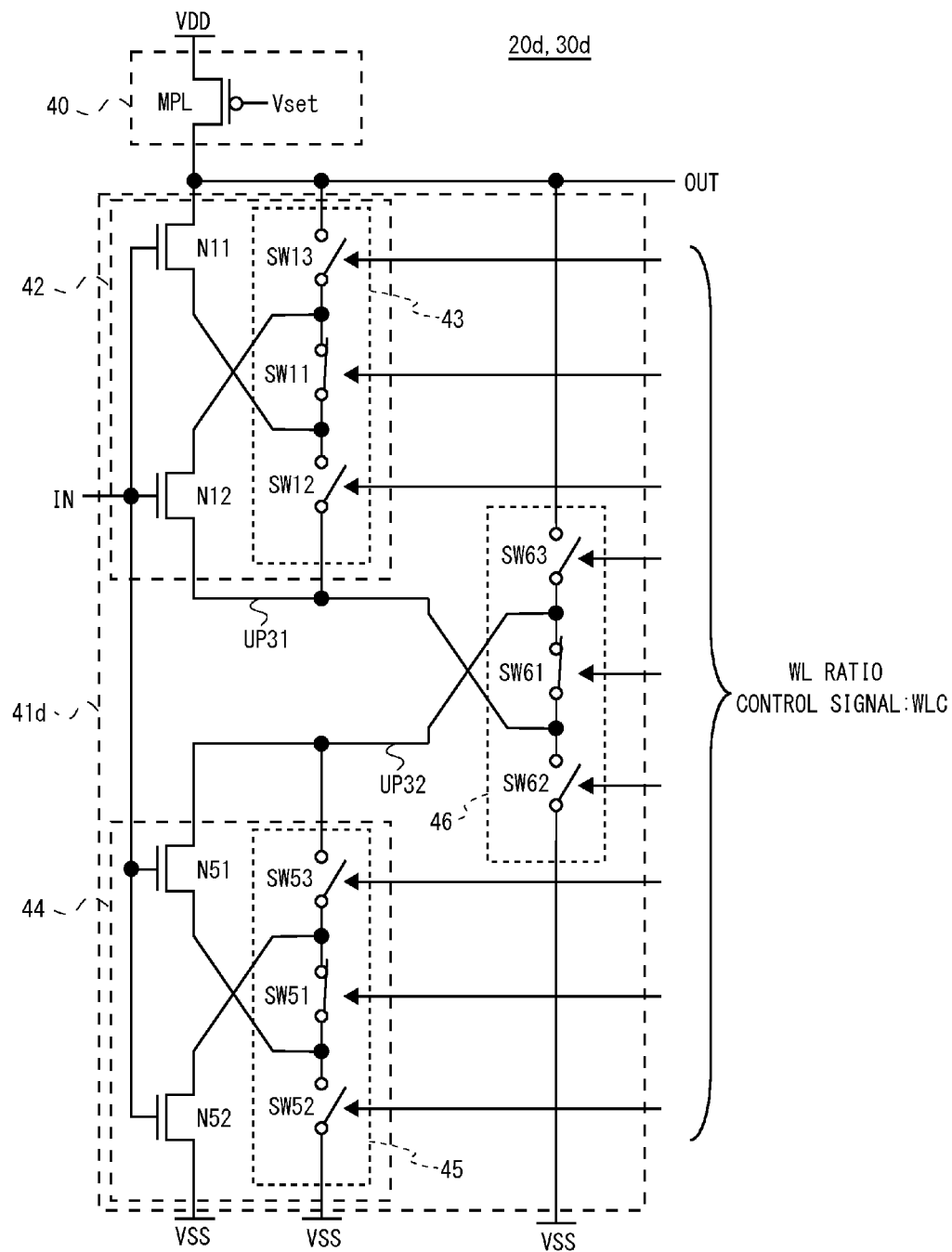
FIG. 14 is a circuit diagram of an inverter gate circuit according to a fifth embodiment.

FIG. 14 is a circuit diagram of the inverter gate circuit 20d according to the fifth embodiment. As illustrated in FIG. 14, the inverter gate circuit 20d according to the fifth embodiment includes a switch unit 41d instead of a switch unit 41. The switch unit 41d includes a unit cell 42 (referred to as a first unit cell below) and, in addition, a second unit cell (e.g. a unit cell 44) and a third connection configuration switch circuit (e.g. a connection configuration switch circuit 46).

The unit cell 42 includes a first transistor (e.g. a NMOS transistor N11), a second transistor (e.g. a NMOS transistor N12) and a first connection configuration switch circuit (e.g. a connection configuration switch circuit 43). The NMOS transistor N11 includes a drain connected to an output terminal, and a source connected to the connection configuration switch circuit 43. The NMOS transistor N12 includes a source connected to a first intra-unit power supply wiring UP31, and a drain connected to the connection configuration switch circuit 43. The connection configuration switch circuit 43 is provided between the output terminal and the first intra-unit power supply wiring UP31, and switches a connection configuration of the NMOS transistors N11 and N12 between the output terminal and the first intra-unit power supply wiring UP31 according to a WL ratio control signal WLC.

The unit cell 44 includes a third transistor (e.g. a NMOS transistor N51), a fourth transistor (e.g. a NMOS transistor N52) and a second connection configuration switch circuit (e.g. a connection configuration switch circuit 45). The NMOS transistor N51 includes a drain connected to a second intra-unit power supply wiring UP32, and a source connected to the connection configuration switch circuit 45. The NMOS transistor N52 includes a source connected to a ground wiring VSS, and a drain connected to the connection configuration switch circuit 45. The connection configuration switch circuit 45 is provided between the output terminal and the second intra-unit power supply wiring UP32, and switches a connection configuration of the NMOS transistors N51 and N52 between the second intra-unit power supply wiring UP32 and the output terminal according to the WL ratio control signal WLC.

The connection configuration switch circuit 46 is provided between the output terminal and the ground wiring VSS, and switches a connection configuration of the unit cells 42 and 44 between the output terminal and the ground wiring VSS according to the WL ratio control signal WLC.

In this regard, the connection configuration switch circuit 43, the connection configuration switch circuit 45 and the connection configuration switch circuit 46 employ the following configurations. The connection configuration switch circuit 43 includes a first switch (e.g. a switch SW11), a second switch (e.g. a switch SW12) and a third switch (e.g. a switch SW13) which are connected in series between the output terminal and the first intra-unit power supply wiring UP31, and are switched between conducting states and blocking states according to the WL ratio control signal WLC. The switch SW11 includes one end connected to the other end of the switch SW13 and a drain of the NMOS transistor N12, and the other end connected to one end of the switch SW12 and a source of the NMOS transistor N11. The switch SW12 includes one end connected to the other end and the source of the NMOS transistor N11, and the other end connected to the first intra-unit power supply wiring UP31. The switch SW13 includes one end connected with the output terminal, and the other end connected to one end of the switch SW11 and the drain of the NMOS transistor N12.

The connection configuration switch circuit 45 includes a fourth switch (e.g. a switch SW51), a fifth switch (e.g. a switch SW52) and a sixth switch (e.g. a switch SW53) which are connected in series between the second intra-unit power supply wiring UP32 and the ground wiring VSS, and are switched between conducting states and blocking states according to the WL ratio control signal WLC. The switch SW51 includes one end connected with the other end of the switch SW53 and the drain of the NMOS transistor N52, and the other end connected to one end of the switch SW52 and the source of the NMOS transistor N51. The switch SW52 includes one end connected to the other end of the switch SW51 and the source of the NMOS transistor N51, and the other end connected to the ground wiring VSS. The switch SW53 includes one end connected with the second intra-unit power supply wiring UP32, and the other end connected to one end of the switch SW51 and the drain of the NMOS transistor N52.

The connection configuration switch circuit 46 includes a seventh switch (e.g. a switch SW61), an eighth switch (e.g. a switch SW62) and a ninth switch (switch SW63) which are connected in series between the output terminal and the ground wiring VSS, and are switched between conducting states and blocking states according to the WL ratio control signal WLC. The switch SW61 includes one end connected with the other end of the switch SW63 and the second intra-unit power supply wiring UP32, and the other end connected to one end of the switch SW62 and the first intra-unit power supply wiring UP31. The switch SW62 includes one end connected with the other end of the switch SW61 and the first intra-unit power supply wiring UP31, and the other end connected to the ground wiring VSS. The switch SW63 includes one end connected with the output terminal, and the other end connected to one end of the switch SW61 and the second intra-unit power supply wiring UP32.

Similar to the inverter gate circuit 20, this inverter gate circuit 20d can change the W/L ratio of the switch transistor configured in the switch unit 41d according to the WL ratio control signal WLC. FIG. 15 is a view for explaining types of connection configurations of the inverter gate circuit 20d according to the fifth embodiment.

As illustrated in FIG. 15, the inverter gate circuit 20d can adopt five types of connection configurations. In a first connection configuration (WL ratio selection signal WLSEL=1), the switches SW11, SW51 and SW61 are in on states, and the other switches are in off states. Thus, the connection configuration of the inverter gate circuit 20d is that the NMOS transistors N11, N12, N51 and N52 are connected in series between the output terminal and the ground wiring VSS. That is, in this first connection configuration, the NMOS transistors N11, N12, N51 and N52 connected in series configure the switch transistor. The W/L ratio of this switch transistor is 1/4 fold compared to when one NMOS transistor configures the switch transistor.

In a second connection configuration (WL ratio selection signal WLSEL=2), the switches SW11, SW51 and SW62 are in on states, and the other switches are in off states. Thus, the connection configuration of the switch unit of the inverter gate circuit 20d is that the NMOS transistors N11 and N12 are connected in series between the output terminal and the ground wiring VSS. That is, in this second connection configuration, the NMOS transistors N11 and N12 configure the switch transistor. The W/L ratio of this switch transistor is 1/2 fold compared to when one NMOS transistor configures the switch transistor.

In a third connection configuration (WL ratio selection signal WLSEL=3), the switches SW12, SW13, SW52, SW53 and SW61 are in on states, and the other switches are in off states. Thus, the connection configuration of the switch unit of the inverter gate circuit 20d is that the NMOS transistors N11 and N12 connected in series and the NMOS transistors N51 and N52 connected in series are connected in parallel between the output terminal and the ground wiring VSS. That is, in this third connection configuration, the NMOS transistors N11, N12, N51 and N52 configure the switch transistor. The W/L ratio of this switch transistor is the same 1 fold as that in case where one NMOS transistor configures the switch transistor.

In a fourth embodiment (WL ratio selection signal WLSEL=4), the switches SW12, SW13, SW52, SW53 and SW62 are in on states, and the other switches are in off states. Thus, the connection configuration of the switch unit of the inverter gate circuit 20d is that the NMOS transistors N11 and N12 are connected in parallel between the output terminal and the ground wiring VSS. That is, in this fourth connection configuration, the NMOS transistors N11 and N12 configure the switch transistor. The W/L ratio of this switch transistor is 2 fold compared to when one NMOS transistor configures the switch transistor.

In a fifth connection configuration (WL ratio selection signal WLSEL=5), the switches SW11, SW12, SW52, SW53, SW62 and SW63 are in on states, and the other switches are in off states. Thus, the connection configuration of the switch unit of the inverter gate circuit 20d is that the NMOS transistors N11, N12, N51 and N52 are connected in parallel between the output terminal and the ground wiring VSS. That is, in this fifth connection configuration, the NMOS transistors N11, N12, N51 and N52 configure the switch transistor. The W/L ratio of this switch transistor is 4 fold compared to when one NMOS transistor configures the switch transistor.

As described above, the inverter gate circuit 20d according to the fifth embodiment controls the unit cell 42 and the unit cell 44 by using the same control signal. Thus, the semiconductor device which uses the inverter gate circuit 20d according to the fifth embodiment can reduce the number of WL ratio control signals WLC while widening the variable range of the W/L ratios of the switch transistors configured in the switch units compared to the semiconductor device which uses the inverter gate circuit 20 according to the first embodiment. Consequently, the semiconductor device according to the fifth embodiment can simplify a circuit while improving an effect of reducing power consumption and oscillation accuracy compared to the semiconductor device according to the first embodiment.

Sixth Embodiment

In a sixth embodiment, a semiconductor device 2 employing a configuration where a selection signal generating unit 50 which switches a value of a WL ratio selection signal WLSEL in response to a change in external environment is provided to a semiconductor device 1 described in the first embodiment will be described. In addition, in the sixth embodiment, components described in the other embodiments will be assigned the same reference numerals used to describe the other embodiments and will not be described. Further, in the sixth embodiment, the semiconductor device 1 will be referred to as an oscillator circuit 1.

Figure 16:
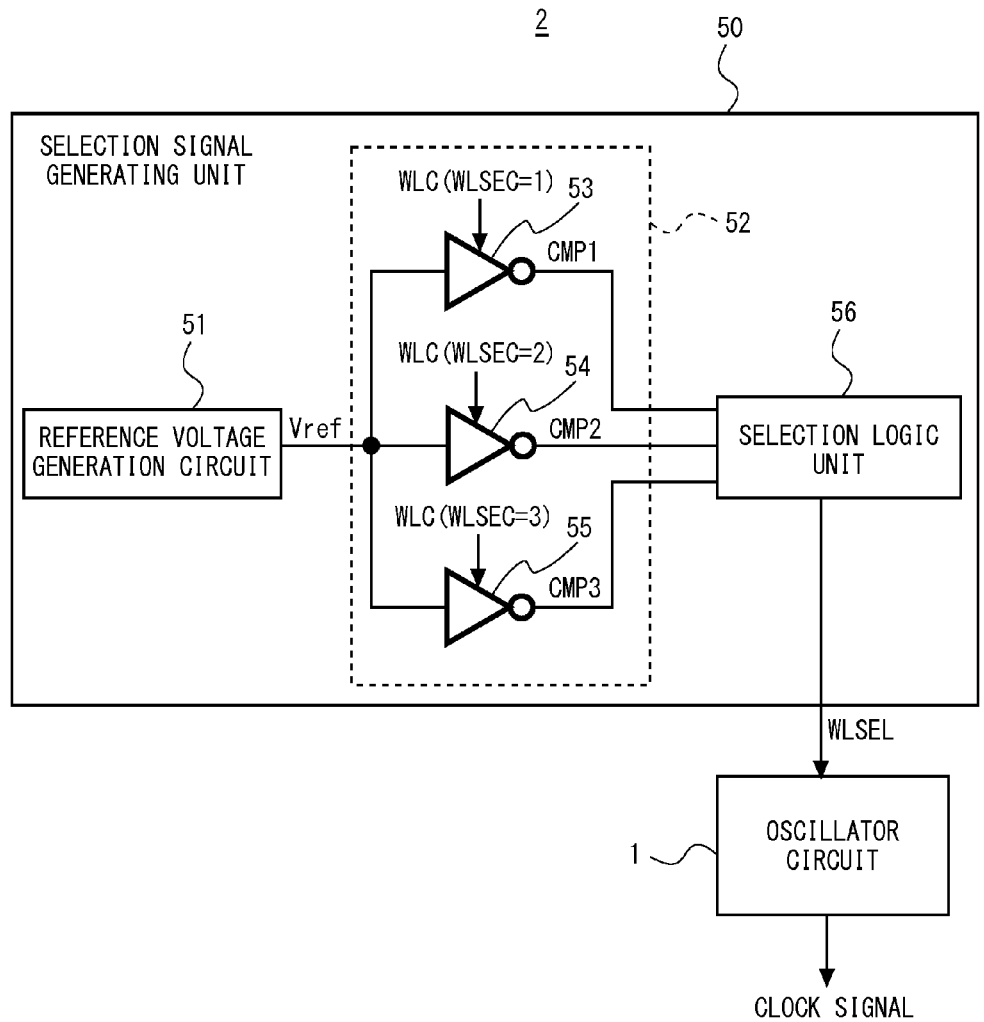
FIG. 16 is a block diagram of a semiconductor device according to a sixth embodiment.

FIG. 16 is a block diagram of the semiconductor device 2 according to the sixth embodiment. As illustrated in FIG. 16, the semiconductor device 2 according to the sixth embodiment employs a configuration where the selection signal generating unit 50 is added to the oscillator circuit 1. The selection signal generating unit 50 outputs a connection configuration selection signal (e.g. a WL ratio selection signal WLSEL) corresponding to external environment. The selection signal generating unit 50 includes a reference voltage generation circuit 51, a threshold voltage determining unit 52 and a selection logic unit 56.

The reference voltage generation circuit 51 generates a reference voltage Vref. This reference voltage Vref is a constant voltage whose fluctuation amount with respect to a temperature is very low. For the reference voltage generation circuit 51, for example, a band gap reference circuit (BGR) is used. Consequently, when a power supply voltage or a temperature fluctuates upon an actual operation, or when a process fluctuation occurs after a semiconductor device is finished, it is possible to output the reference voltage Vref of a fixed value at all times.

The threshold voltage determining unit 52 includes a plurality of inverter gate circuits which receive the reference voltage Vref as an input voltage and in which connection configurations of a plurality of transistors of a switch unit are fixed to different modes in advance. In an example illustrated in FIG. 16, the threshold voltage determining unit 52 includes inverter gate circuits 53 to 55. The inverter gate circuit 53 is an inverter gate circuit 20 whose WL ratio control signal WLC is fixed to a value corresponding to 1 which is a value of a WL ratio selection signal WLSEL. The inverter gate circuit 54 is the inverter gate circuit 20 whose WL ratio control signal is fixed to a value corresponding to 2 which is the value of the WL ratio selection signal WLSEL. The inverter gate circuit 55 is the inverter gate circuit 20 whose WL ratio control signal WLC is fixed to a value corresponding to 3 which is the value of the WL ratio selection signal WLSEL. In addition, the value of the WL ratio selection signal WLSEL is, for example, a value of a table illustrated in FIG. 6. Further, the inverter gate circuit 53 outputs an output value CMP1, the inverter gate circuit 54 outputs an output value CMP2 and the inverter gate circuit 55 outputs a output value CMP3.

The selection logic unit 56 switches the value of the WL ratio selection signal WLSEL according to a combination of the output values CMP1 to CMP3 of a plurality of inverter gate circuits.

According to the configuration, the selection signal generating unit 50 changes the number of inverter gate circuits whose temperatures of semiconductor chips reach high levels. For example, as the temperature of the semiconductor chip rises, a logic threshold voltage VTH of the inverter gate circuit lowers. Meanwhile, the reference voltage Vref keeps a fixed voltage with respect to the temperature of the semiconductor chip. Hence, in the threshold voltage determining unit 52, as the temperatures of the semiconductor chips rise, the number of inverter gate circuits whose output values reach high levels decreases. Further, the selection signal generating unit 50 causes the selection logic unit 56 to change the value of the WL ratio selection signal WLSEL according to the number of output values of inverter gate circuits which reach high levels.

In this regard, an example of the value of the WL ratio selection signal WLSEL with respect to a combination of the output values CMP1 to CMP3 in the selection logic unit 56 will be described. FIG. 17 illustrates a table for explaining optimal control examples of the semiconductor device 2 according to the sixth embodiment. In addition, FIG. 17 illustrates two control examples.

In control example 1 illustrated in the upper view of FIG. 17, every time the number of high levels (e.g. H) increase, the value of the WL ratio selection signal WLSEL is increased. All of the logic threshold voltages VTH of the inverter gate circuits 53 to 55 are lower than the reference voltage Vref, so that, when the output values CMP1 and CMP2 reach low levels, it is optimal to raise the logic threshold voltages VTH of inverter gate circuits 20 and 30 in the oscillator circuit 1 to the highest logic threshold voltages. Hence, in control example 1, when the output values CMP1 to CMP3 are at low levels, the value (e.g. 1) of the WL ratio selection signal WLSEL which can specify the highest logic threshold voltage VTH is outputted to the selection logic unit 56.

Only the logic threshold voltage VTH of the inverter gate circuit 53 is higher than the reference voltage Vref, so that, when only the output value CMP1 reaches the high level, it is optimal to lower the logical threshold voltages by one level from the level at which the logic threshold voltages VTH of the inverter gate circuits 20 and 30 in the oscillator circuit 1 become the highest. Hence, in control example 1, when only the output value CMP1 is at the high level, the value (e.g. 2) of the WL ratio selection signal WLSEL which can specify the logic threshold voltage VTH which is one level lower than the highest logic threshold voltage VTH is outputted to the selection logic unit 56.

The logic threshold voltages VTH of the inverter gate circuits 53 and 54 are higher than the reference voltage Vref, so that, when the output values CMP1 and CMP2 reach the high levels, it is optimal to lower the logic threshold voltages VTH of the inverter gate circuits 20 and 30 in the oscillator circuit 1 to the lowest logic threshold voltages. Hence, in control example 1, when all output values CMP1 and CMP2 are at the high levels, the value (e.g. 3) of the WL ratio selection signal WLSEL which can specify the lowest logic threshold voltage VTH is outputted to the selection logic unit 56. In addition, the selection logic unit 56 according to the sixth embodiment can only select the three WL ratio selection signals WLSEL, and therefore outputs the WL ratio selection signal WLSEL which can specify the lowest logic threshold voltage VIII when the output values CMP1 to CMP3 reach the high levels.

Further, control example 2 illustrated in FIG. 17 is another embodiment of control example 1, the value of the WL ratio selection signal WLSEL takes 1 in two states where all of the output values CMP1 to CMP3 are at low levels and only the output value CMP1 is at the high level, and the WL ratio selection signal WLSEL takes 2 or 3 in other states.

As described above, the semiconductor device 2 according to the sixth embodiment uses a plurality of inverter gate circuits employing the same configuration as that of the inverter gate circuit 20 and sets a fixed value to the WL ratio control signal WLC which is supplied to a plurality of inverter gate circuits. Further, a plurality of these inverter gate circuits are used to configure the threshold voltage determining unit 52. Consequently, the semiconductor device 2 according to the sixth embodiment can realize as a small circuit a comparator in the threshold voltage determining unit 52.

Further, the number of inverter gate circuits in the threshold voltage determining unit 52 can be increased or decreased according to the number of values of WL ratio selection signal WLSEL. In this case, the semiconductor device 2 according to the sixth embodiment can suppress an increase in a circuit area by using as the comparator in the threshold voltage determining unit 52 the inverter gate circuits employing the same configuration as that of the inverter gate circuit 20.

Further, the number of inverter gate circuits in the threshold voltage determining unit 52 may be one. In this case, it is possible to determine the value of the WL ratio selection signal WLSEL by changing the WL ratio control signal WLC to be supplied to the inverter gate circuit in response to a change in a time, storing output values of individual connection configurations in a register or the like and referring to the table illustrated in FIG. 17 after a certain time passes. In addition, a delay produced until a determination result is outputted increases compared to the threshold voltage determining unit 52 configured by a plurality of inverter gate circuits. However, a logic threshold voltage of the inverter gate circuit does not fluctuate at a high speed in response to a temperature fluctuation, and therefore there is not a significant problem.

Further, the selection signal generating unit 50 uses the reference voltage generation circuit 51. However, voltage accuracy of the reference voltage Vref to be outputted may not be high. Further, when a reference potential generator is prepared outside, the reference voltage generation circuit 51 may be also removed from the selection signal generating unit 50.

Seventh Embodiment

A semiconductor device 3 which is a modified example of the semiconductor device 2 according to the sixth embodiment will be described in the seventh embodiment. In addition, in the seventh embodiment, components described in the other embodiments will be assigned the same reference numerals used to describe the other embodiments and will not be described. Further, in the seventh embodiment, a semiconductor device 1 will be referred to as an oscillator circuit 1.

Figure 18:
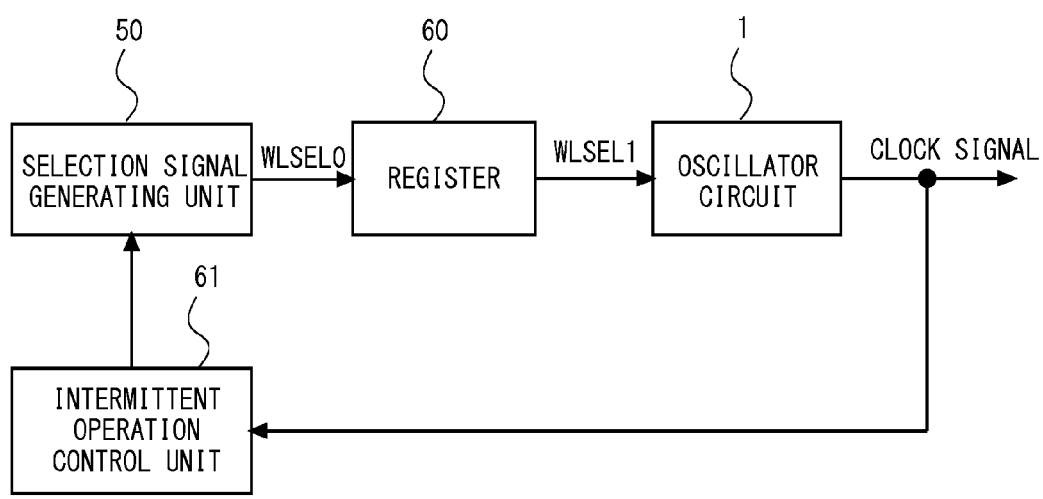
FIG. 18 is a block diagram of a semiconductor device according to a seventh embodiment.

FIG. 18 illustrates a block diagram of the semiconductor device 3 according to the seventh embodiment. As illustrated in FIG. 18, the semiconductor device 3 according to the seventh embodiment employs a configuration where a register 60 and an intermittent operation control unit 61 are added to the semiconductor device 2 according to the second embodiment. The intermittent operation control unit 61 outputs at a fixed interval an intermittent operation control signal for operating a selection signal generating unit 50. More specifically, the intermittent operation control unit 61 counts a clock signal outputted from the oscillator circuit 1, and outputs an intermittent operation control signal in response to that a count value has reached a fixed value. The selection signal generating unit 50 performs an operation of updating the value of the WL ratio selection signal in response to that this intermittent operation control signal has entered an active state (e.g. a high level). The register 60 holds a value of a connection configuration selection signal, and outputs a WL ratio selection signal WLSEL1 to a W/L ratio control unit 10 in the oscillator circuit 1 according to the held value.

Figure 19:
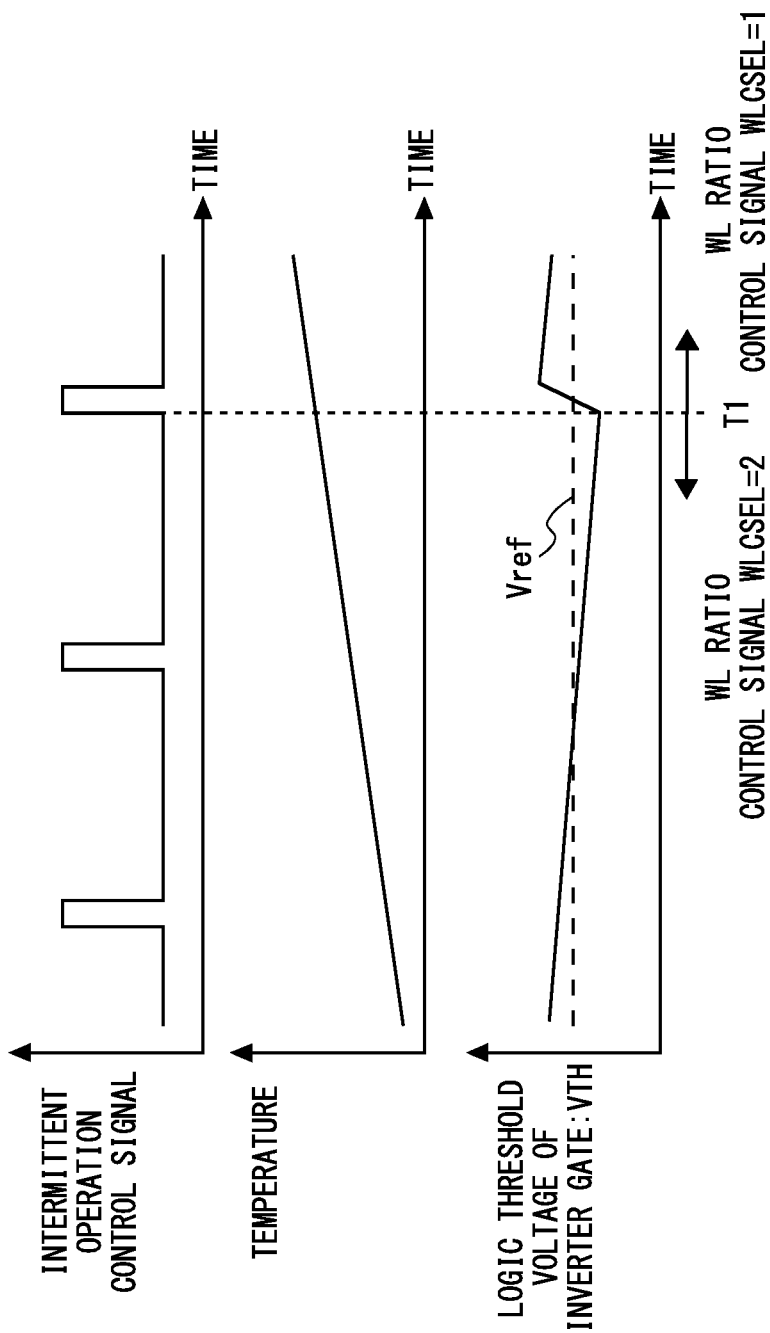
FIG. 19 is a timing chart for explaining an operation of the semiconductor device according to the seventh embodiment.

Next, an operation of the semiconductor device 3 according to the seventh embodiment will be described. Next, FIG. 19 is a timing chart for explaining the operation of the semiconductor device according to the seventh embodiment. In an example illustrated in FIG. 19, a horizontal axis indicates passage of time. Further, the timing chart illustrated in FIG. 19 indicates that a temperature of a semiconductor chip rises as the time passes.

As illustrated in FIG. 19, in the semiconductor device 3 according to the seventh embodiment, the intermittent operation control unit 61 switches the intermittent operation control signal to a high level at a fixed cycle and monitors a fluctuation of a logic threshold voltage VTH on a regular basis. Further, as the temperature rises, the logic threshold voltages VTH of the inverter gate circuits lower. In addition, in the timing chart illustrated in FIG. 19, a value of the WL ratio selection signal WLSEL takes 2 in a period before a timing T1. Further, in the example illustrated in FIG. 19, at the timing T1 at which the intermittent operation control signal reaches a high level, the logic threshold voltages of the inverter gate circuits go below a reference voltage Vref outputted from a reference voltage generation circuit 51. Hence, the selection signal generating unit 50 which operates at the timing T1 according to the intermittent operation control signal switches the value of the WL ratio selection signal WLSEL from 2 to 1. Thus, the semiconductor device 3 according to the seventh embodiment switches to high values the logic threshold voltages of the inverter gate circuits which have lowered in response to the temperature.

As described above, in the semiconductor device 3 according to the seventh embodiment, the intermittent operation control unit 61 causes the selection signal generating unit 50 to intermittently operate, so that it is possible to reduce power consumption of the selection signal generating unit 50. Further, in the semiconductor device 3 according to the seventh embodiment, the register 60 holds the value of the WL ratio selection signal WLSEL outputted in a period in which the selection signal generating unit 50 operates. Consequently, even when a power supply to the selection signal generating unit 50 is stopped, the semiconductor device 3 according to the seventh embodiment can maintain the WL ratio selection signal WLSEL to be supplied to the oscillator circuit 1. In addition, the register 60 consumes power upon an update of a value, yet power to hold the value is at such a very low degree that power consumption of the register 60 can be ignored.

Eighth Embodiment

A semiconductor device 4 which is a modified example of a semiconductor device 2 according to the first embodiment will be described in the eighth embodiment. In addition, in the eighth embodiment, components described in the other embodiments will be assigned the same reference numerals used to describe the other embodiments and will not be described. Further, in the eighth embodiment, the semiconductor device 4 will be referred to as the oscillator circuit 1.

Figure 20:
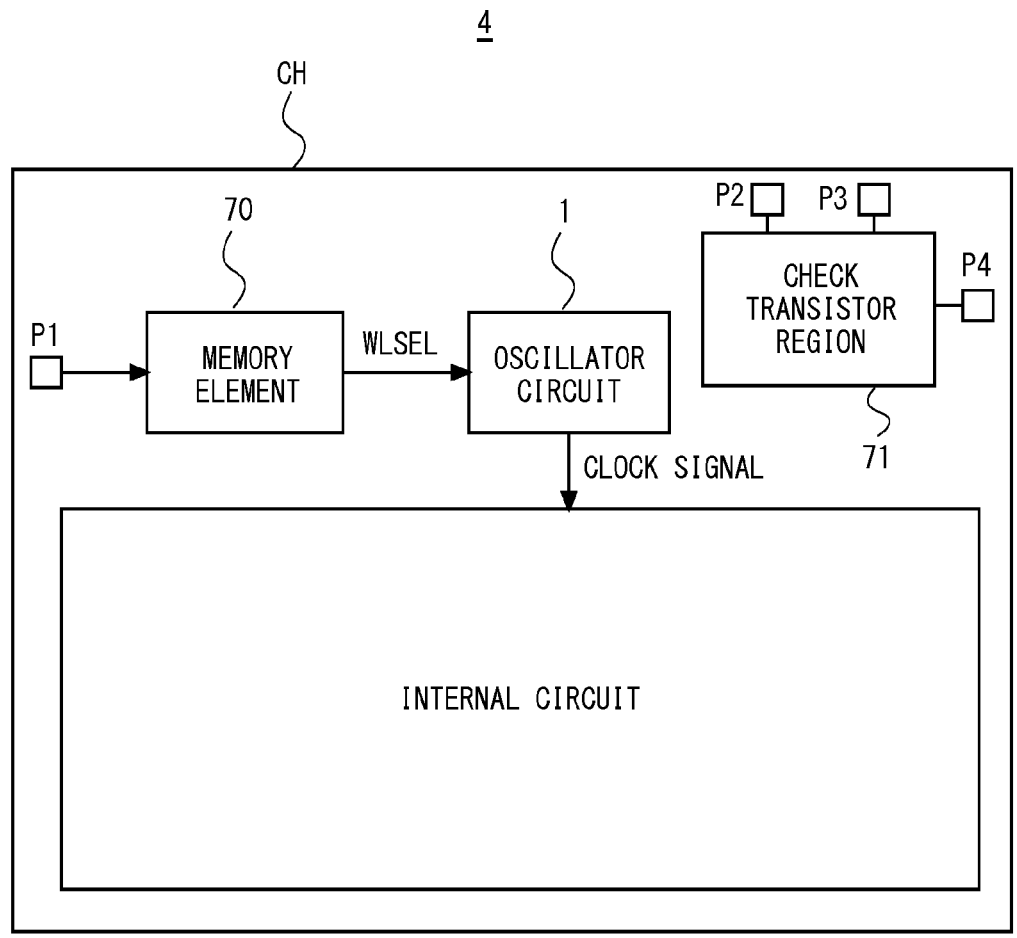
FIG. 20 is a block diagram of a semiconductor device according to an eighth embodiment.

FIG. 20 is a block diagram of a semiconductor device 4 according to the eighth embodiment. As illustrated in FIG. 20, the semiconductor device 4 according to the eighth embodiment includes the oscillator circuit 1, a selection signal generating unit 50, a check transistor region 71 and pads P1 to P4 and an internal circuit on one semiconductor chip CH. In addition, the internal circuit is a logic circuit which realizes a predetermined function based on a clock signal outputted from the oscillator circuit 1.

A memory element 70 stores a value of a WL ratio selection signal WLSEL supplied from another device through the pad P1, and outputs the stored value as the WL ratio selection signal to the oscillator circuit 1. In addition, a non-volatile memory element is preferably used for the memory element 70. The check transistor region 71 is a region on which a check transistor which checks a threshold voltage of a transistor formed in the same chip is formed. Further, the pads P2 to P4 are connected to the check transistor region 71. The pads P2 to P4 are pads which enable an access to the check transistor formed in the check transistor region 71.

Next, a method of determining a value of the WL ratio selection signal WLSEL in the semiconductor device 4 according to the eighth embodiment will be described. The semiconductor device 4 according to the eighth embodiment checks a threshold voltage of the check transistor of the check transistor region 71 upon, for example, an inspection such as a shipping test. Further, a value of the WL ratio selection signal WLSEL is determined by another device such as a tester based on the checked threshold voltage of the check transistor. Subsequently, the determined value of the WL ratio selection signal WLSEL is written in the memory element 70.

As described above, the semiconductor device 4 according to the eighth embodiment can determine the WL ratio selection signal WLSEL according to threshold voltage characteristics of the transistor on the semiconductor chip checked by the check transistor. Consequently, the semiconductor device 4 according to the eighth embodiment can save a semiconductor chip which cannot normally operate due to a process fluctuation, and improve a yield rate.

In addition, it is also possible to use a non-volatile memory element for the memory element 70. In this case, upon activation of the semiconductor device 4, by reading the value of the WL ratio selection signal WLSEL determined based on the threshold voltage characteristics of the check transistor from another non-volatile memory medium, and writing the value in the memory element 70, it is possible to provide the same effect as that obtained when a non-volatile memory is used for the memory element 70.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first to eighth embodiments can be combined as desirable by one of ordinary skill in the art.

For example, the semiconductor device according to the above embodiment may employ a configuration where conduction types (the p type or an n type) of a semiconductor substrate, a semiconductor layer, a diffusion layer (diffusion region) and the like are inverted. Hence, when the conduction type of one of the n type and the type is a first conduction type, and the other conduction type is a second condition type, the first conduction type can be set to the p type and the second conduction type can be set to the n type, and the first conduction type can be set to the n type and the second condition type can be set to the p type.

What is claimed is:

1. A semiconductor device comprising: an inverter gate circuit that inverts and outputs a logic level of an input signal, wherein
the inverter gate circuit includes
a constant current source that includes one end connected to a first power supply wiring, and an other end connected to an output terminal,
a control circuit that outputs a control signal, and
a switch unit that is connected between the output terminal and a second power supply wiring, and is switched between a conducting state and a blocking state according to the input signal, and
the switch unit includes
a plurality of transistors whose control terminal receive an input of the input signal, and
a connection configuration switch circuit that switches real values of a gate length and a gate width of a switch transistor according to the control signal, the switch transistor being configured by a transistor to which a current outputted from the constant current source is applied among the plurality of transistors.

2. The semiconductor device according to claim 1, wherein
the switch unit includes
a first transistor that includes a first terminal connected to the output terminal, and
a second transistor that includes a second terminal connected to the second power supply wiring, and
the connection configuration switch circuit switches a connection configuration of the first transistor and the second transistor between the output terminal and the second power supply wiring according to the control signal.

3. The semiconductor device according to claim 2, wherein
the connection configuration switch circuit includes a first switch, a second switch and a third switch that are connected in series between the output terminal and the second power supply wiring, and are switched between the conducting state and the blocking state according to the control signal,
the first switch includes one end connected with an other end of the third switch and a first terminal of the second transistor, and an other end connected to one end of the second switch and a second terminal of the first transistor,
the second switch includes the one end connected with the other end of the first switch and the second terminal of the first transistor, and an other end connected to the second power supply wiring, and
the third switch includes one end connected with the output terminal, and the other end connected to the one end of the first switch and the first terminal of the second transistor.

4. The semiconductor device according to claim 3, wherein
the connection configuration switch circuit further includes a fourth switch, and
the fourth switch is connected between the first terminal of the first transistor and the output terminal.

5. The semiconductor device according to claim 1, wherein
the switch unit includes
a unit cell that is provided between the output terminal and an intra-unit power supply wiring, and includes a first transistor including a first terminal connected to the output terminal and a second transistor including a second terminal connected to the intra-unit power supply wiring,
a first connection configuration switch circuit that is provided in the unit cell and is provided between the output terminal and the intra-unit power supply wiring,
a third transistor that includes a second terminal connected to the second power supply wiring, and
a second connection configuration switch circuit that is provided between the output terminal and the second power supply wiring,
the first connection configuration switch circuit switches a connection configuration of the first transistor and the second transistor between the output terminal and the intra-unit power supply wiring according to the control signal, and
the second connection configuration switch circuit switches a connection configuration of the unit cell and the third transistor connection configuration between the output terminal and the second power supply wiring according to the control signal.

6. The semiconductor device according to claim 5, wherein
the first connection configuration switch circuit includes a first switch, a second switch and a third switch that are connected in series between the output terminal and the intra-unit power supply wiring, and are switched between the conducting state and the blocking state according to the control signal,
the first switch includes one end connected with an other end of the third switch and a first terminal of the second transistor, and an other end connected to one end of the second switch and a second terminal of the first transistor,
the second switch includes the one end connected with the other end of the first switch and the second terminal of the first transistor, and an other end connected to the intra-unit power supply wiring,
the third switch includes one end connected with the output terminal, and the other end connected to the one end of the first switch and the first terminal of the second transistor,
the second connection configuration switch circuit includes a fourth switch, a fifth switch and a sixth switch that are connected in series between the output terminal and the second power supply wiring, and are switched between the conducting state and the blocking state according to the control signal,
the fourth switch includes one end connected with an other end of the sixth switch and a first terminal of the third transistor, and an other end connected to one end of the fifth switch and the intra-unit power supply wiring,
the fifth switch includes the one end connected with the other end of the fourth switch and the intra-unit power supply wiring, and an other end connected to the second power supply wiring, and
the sixth switch includes one end connected with the output terminal, and the other end connected to the one end of the fourth switch and the first terminal of the third transistor.

7. The semiconductor device according to claim 1, wherein
the switch unit includes
a unit cell that is provided between the output terminal and a first intra-unit power supply wiring, and includes a first transistor including a first terminal connected to the output terminal and a second transistor including a second terminal connected to the first intra-unit power supply wiring,
a first connection configuration switch circuit that is provided in the unit cell and is provided between the output terminal and the intra-unit power supply wiring,
a third transistor that includes a second terminal connected to a second intra-unit power supply wiring,
a second connection configuration switch circuit that is provided between the output terminal and the second intra-unit power supply wiring,
a fourth transistor that includes a second terminal connected to the second power supply wiring, and
a third connection configuration switch circuit that is provided between the output terminal and the second power supply wiring,
the first connection configuration switch circuit switches a connection configuration of the first transistor and the second transistor between the output terminal and the first intra-unit power supply wiring according to the control signal,
the second connection configuration switch circuit switches a connection configuration of the unit cell and the third transistor between the output terminal and the second intra-unit power supply wiring according to the control signal, and
the third connection configuration switch circuit switches a connection configuration of the unit cell, the third transistor and the fourth transistor between the output terminal and the second power supply wiring according to the control signal.

8. The semiconductor device according to claim 7, wherein
the first connection configuration switch circuit includes a first switch, a second switch and a third switch that are connected in series between the output terminal and the first intra-unit power supply wiring, and are switched between the conducting state and the blocking state according to the control signal,
the first switch includes one end connected with an other end of the third switch and a first terminal of the second transistor, and an other end connected to one end of the second switch and a second terminal of the first transistor,
the second switch includes the one end connected with the other end of the first switch and the second terminal of the first transistor, and an other end connected to the intra-unit power supply wiring,
the third switch includes one end connected with the output terminal, and the other end connected to the one end of the first switch and the first terminal of the second transistor,
the second connection configuration switch circuit includes a fourth switch, a fifth switch and a sixth switch that are connected in series between the output terminal and the second power supply wiring, and are switched between the conducting state and the blocking state according to the control signal,
the fourth switch includes one end connected with an other end of the sixth switch and a first terminal of the third transistor, and an other end connected to one end of the fifth switch and the first intra-unit power supply wiring,
the fifth switch includes the one end connected with the other end of the fourth switch and the intra-unit power supply wiring, and an other end connected to the second intra-unit supply wiring, and the sixth switch includes one end connected with the output terminal, and the other end connected to the one end of the fourth switch and the first terminal of the third transistor, the third connection configuration switch circuit includes a seventh switch, an eighth switch and a ninth switch that are connected in series between the output terminal and the second power supply wiring, and are switched between the conducting state and the blocking state according to the control signal, the seventh switch includes one end connected with an other end of the ninth switch and a second terminal of the fourth transistor, and an other end connected to one end of the eighth switch and the second intra-unit power supply wiring, the eighth switch includes the one end connected with the other end of the seventh switch and the second intra-unit power supply wiring, and an other end connected to the second power supply wiring, and the ninth switch includes one end connected with the output terminal, and the other end connected to the one end of the seventh switch and the first terminal of the fourth transistor.

9. The semiconductor device according to claim 1, wherein the switch unit includes a first unit cell that is provided between the output terminal and a first intra-unit power supply wiring, and includes a first transistor including a first terminal connected to the output terminal and a second transistor including a second terminal connected to the first intra-unit power supply wiring, a second unit cell that is provided between a second intra-unit power supply wiring and the second power supply wiring, and includes a third transistor including a first terminal connected to the second intra-unit power supply wiring and a fourth transistor including a second terminal connected to the second intra-unit power supply wiring, a first connection configuration switch circuit that is provided in the first unit cell and is provided between the output terminal and the first intra-unit power supply wiring, a second connection configuration switch circuit that is provided in the second unit cell and is provided between the second intra-unit power supply wiring and the second power supply wiring, and a third connection configuration switch circuit that is provided between the output terminal and the second power supply wiring, the first connection configuration switch circuit switches a connection configuration of the first transistor and the second transistor between the output terminal and the first intra-unit power supply wiring according to the control signal, the second connection configuration switch circuit switches a connection configuration of the third transistor and the fourth transistor between the second intra-unit power supply wiring and the second power supply wiring according to the control signal, and the third connection configuration switch circuit switches a connection configuration of the first unit cell and the second unit cell between the output terminal and the second power supply wiring according to the control signal.

10. The semiconductor device according to claim 9, wherein the first connection configuration switch circuit includes a first switch, a second switch and a third switch that are connected in series between the output terminal and the first intra-unit power supply wiring, and are switched between the conducting state and the blocking state according to the control signal, the first switch includes one end connected with another end of the third switch and a first terminal of the second transistor, and an other end connected to one end of the second switch and a second terminal of the first transistor, the second switch includes the one end connected with the other end of the first switch and the second terminal of the first transistor, and an other end connected to the intra-unit power supply wiring, the third switch includes one end connected with the output terminal, and the other end connected to the one end of the first switch and the first terminal of the second transistor, the second connection configuration switch circuit includes a fourth switch, a fifth switch and a sixth switch that are connected in series between the second-train unit power supply wiring and the second power supply wiring, and are switched between the conducting state and the blocking state according to the control signal, the fourth switch includes one end connected with an other end of the sixth switch and a first terminal of the fourth transistor, and an other end connected to one end of the fifth switch and a second terminal of the third transistor, the fifth switch includes the one end connected with the other end of the fourth switch and the second terminal of the third transistor, and an other end connected to the second power supply wiring, the sixth switch includes one end connected with the second intra-unit power supply wiring, and the other end connected to the one end of the fourth switch and the first terminal of the fourth transistor, the third connection configuration switch circuit includes a seventh switch, an eighth switch and a ninth switch that are connected in series between the output terminal and the second power supply wiring, and are switched between the conducting state and the blocking state according to the control signal, the seventh switch includes one end connected with an other end of the ninth switch and the second intra-unit power supply wiring, and an other end connected to one end of the eighth switch and the first intra-unit power supply wiring, the eighth switch includes the one end connected with the other end of the seventh switch and the first intra-unit power supply wiring, and an other end connected to the second power supply wiring, and the ninth switch includes one end connected with the output terminal, and the other end connected to the one end of the seventh switch and the second intra-unit power supply wiring.

11. The semiconductor device according to claim 1, wherein the control circuit switches an indication value indicated by the control signal according to a value of a connection configuration selection signal supplied from another circuit block.

12. The semiconductor device according to claim 11, further comprising: a selection signal generating unit that outputs the connection configuration selection signal, wherein the selection signal generating unit includes
a reference voltage generation circuit that generates a reference voltage,
a plurality of inverter gate circuits that receive the reference voltage as an input voltage, and whose connection configurations of the switch unit are fixed to different modes, and
a selection logic circuit that switches the value of the connection configuration selection signal according to a combination of output values of the plurality of inverter gate circuits.

13. The semiconductor device according to claim 12, further comprising:
an intermittent operation control unit that operates the selection signal generating unit at a fixed interval; and
a register that holds the value of the connection configuration selection signal and outputs the connection configuration selection signal to the control circuit according to the held value.

14. The semiconductor device according to claim 11, further comprising:
a check transistor region in which a check transistor that checks a threshold voltage of transistors formed in the same chip is formed; and
a memory element that stores the value of the connection configuration selection signal determined according to the threshold voltage checked by the check transistor, and outputs the stored value as the connection configuration selection signal.

15. The semiconductor device according to claim 1, further comprising:
a bias voltage generation circuit that includes a feedback circuit including the inverter gate circuit, and outputs a bias voltage that fluctuates according to a current amount of an output current of the feedback circuit,
an integrator that generates an integration result signal by charging a constant current determined by the current amount based on the bias voltage and resetting a charged charge according to a charge/discharge control signal for switching between a charging operation and a charge resetting operation;
a level detector that causes the inverter gate circuit to detect a voltage level of the integration result signal, and outputs a level detection signal; and
an oscillation control circuit that switches a logic level of a clock signal according to the level detection signal, and outputs the charge/discharge control signal to be supplied to the integrator according to the level detection signal.

* * * * *